United States Patent [19]
Okuno et al.

[11] Patent Number: 5,654,583
[45] Date of Patent: Aug. 5, 1997

[54] SEMICONDUCTOR DEVICE HAVING FIRST AND SECOND SEMICONDUCTOR STRUCTURES DIRECTLY BONDED TO EACH OTHER

[75] Inventors: Yae Okuno, Kokubunji; Kazuhisa Uomi, Hachioji; Masahiro Aoki; Misuzu Sagawa, both of Kokubunji, all of Japan

[73] Assignee: Hitachi, Ltd., Tokyo, Japan

[21] Appl. No.: 494,228

[22] Filed: Jun. 23, 1995

[30] Foreign Application Priority Data

Jun. 24, 1994 [JP] Japan .................................. 6-142862

[51] Int. Cl.$^6$ .......................... H01L 29/22; H01L 29/20; H01L 29/04
[52] U.S. Cl. ...................... 257/627; 257/628; 257/614; 257/615
[58] Field of Search ...................... 257/627, 628, 257/614, 615

[56] References Cited

U.S. PATENT DOCUMENTS

| | | | |
|---|---|---|---|
| 5,231,302 | 7/1993 | Hironaka | 257/627 |
| 5,418,374 | 5/1995 | Morita et al. | 257/627 |

FOREIGN PATENT DOCUMENTS

| | | |
|---|---|---|
| 48-40372 | 6/1973 | Japan . |
| 6-38536 | 5/1994 | Japan . |

OTHER PUBLICATIONS

"Semiconductor Lasers on Si Substrates Using The Technology of Bonding By Atomic Rearrangement", Appln. Phys. Lett., 62(10), Mar. 8, 1993, pp. 1961–1963.

"Fabrication of (001) InP–based 1.55 um Wavelength Lasers on a (110) GaAs Substrate by Direct Bonding (A prospect for Free–Orientation Integration)", Appln. Phys. Lett., 67(6), Aug. 7, 1995, pp. 810–812.

"Anti–phase Direct Bonding and its Application to the Fabrication of InP–based 1.55 um Wavelength Lasers on GaAs Substrates," Appln. Phys. Lett. 66(4), Jan. 23, 1995, pp. 451–453.

Y. Lo, "Bonding by Atomic Rearrangement of InP/InGaAsP 1.5 µm Wavelength Lasers on GaAs Substrates", Appl. Phys. Lett. 58 (18) May 6, 1991.

L. Gordon et al., "Diffusion–Bonded Stacked GaAs for Quasi–phase–matched second–harmonic generation of a carbon dioxide laser", Electronics Letters, vol. 29, No. 22, Oct. 28, 1993.

*Primary Examiner*—Mahshid D. Saadat
*Assistant Examiner*—Valencia Martin Wallace
*Attorney, Agent, or Firm*—Antonelli, Terry, Stout & Kraus, LLP.

[57] ABSTRACT

The semiconductor device has a semiconductor structure directly bonded onto another semiconductor structure of a different kind from the former. These two semiconductor structures are arranged in such a way that their crystal structures in a cross section perpendicular to the bonded interface of the two semiconductor structures are different from each other or that their lattice orders are not equivalent. This can be applied to direct bonding of any combination of semiconductor structures in any crystallographic orientation relation. This also allows bonding of three or more kinds of semiconductor structures.

69 Claims, 22 Drawing Sheets

2

SEMICONDUCTOR DEVICE HAVING FIRST AND SECOND SEMICONDUCTOR STRUCTURES DIRECTLY BONDED TO EACH OTHER

BACKGROUND OF THE INVENTION

The present invention relates to a structure of semiconductor device and a method of manufacture thereof.

To increase the capacity of data communication, it is desired that a variety of kinds of circuit components to be integrated to develop highly integrated small devices with sophisticated functions. For this end, a technology is required that permits free integration of semiconductor devices of different kinds. A technology currently in wide use for making a semiconductor layered structure that constitutes a fundamental structure of the semiconductor device elements is an epitaxial growth. The drawbacks of the epitaxial growth technology include the difficulty in growing on a substrate a layer whose lattice constant and thermal expansion coefficient are different from those of the substrate and the fact that the crystallographic orientation of the grown layer is limited to the same crystallographic orientation of the substrate. Hence, it is difficult to integrate two semiconductor devices if the physical property constants of their constituent materials, such as lattice constant and thermal expansion cosfficient, are different from each other. Moreover, when the crystallographic orientations of the constituent materials differ from each other, the semiconductor devices cannot be integrated.

To deal with these problems, a method has been proposed in recent years, which directly bonds two semiconductors at elevated temperatures and under some pressures without using adhesives or interposing an insulating film. As described in the Applied Physics Letters, 58, 1961 (1991), this method is reported to be able to unite semiconductors, such as InP and GaAs, having greatly different physical properties like lattice constant and to form a semiconductor device with good characteristics. The InP and GaAs directly bonded together, however, have the same crystallographic orientations, and there are no reports on a case where two kinds of semiconductors are bonded together with different crystallographic orientations.

The Electronics Letters, 29 1942 (1993), and Japan Patent Publication No. 38536/1994 describe a method of directly bonding semiconductors with different crystallographic orientations to form a single device. However, the two semiconductors bonded together are combinations of GaAs and GaAs, and of InP and InP in each documents, that is, the bonding combination is limited to the same kind of semiconductors. It is also noted that in either case of direct bonding, the device produced by bonding two semiconductors is single devices and that no method is presented for manufacturing integrated devices.

SUMMARY OF THE INVENTION

With direct bonding, it is possible to form a semiconductor device of good quality on a semiconductor substrate of different kind having a different physical property from the device. It is also possible to form single devices by directly bonding a semiconductor substrate and a semiconductor layer of the same kind changing their crystallographic orientation relation. Such fabrication of semiconductor devices cannot be implemented by epitaxial growth and therefore the direct bonding can be said to be a technique with excellent features.

These device manufacturing means, however, are still limited in the degree of freedom of integration. The former method, while it can fabricate a device on a substrate of different kind, has a drawback that the crystallographic orientation of the device is limited by that of the substrate. Because the characteristics of individual semiconductor devices are improved by selecting optimum crystallographic orientations, this fabrication method may produce only devices with insufficient characteristics. On the other hand, although the latter method can change the crystallographic orientation relation, it has a restriction that the material of the device need to be the same as that of the substrate. Because the characteristics of the devices depend greatly on the physical properties of the semiconductor materials, if the materials of the device and the substrate are limited to one and the same material, the combination of the semiconductor devices to be integrated is necessarily limited and it seems impossible to manufacture integrated devices with such sophisticated functions as will contribute to increase the capacity of data communication.

The objective of the present invention is to provide a technique that utilizes two features of the direct bonding, that different kinds of semiconductor materials can be integrated and that semiconductor materials with different crystallographic orientations can be integrated, in order to substantially enhance the degree of freedom of the device design and to improve the performance of the integrated devices.

The above objective can be achieved, when directly bonding onto a first semiconductor structure a second semiconductor structure with a different lattice constant from the first semiconductor structure, by arranging the second semiconductor structure on the first semiconductor structure in such a way in a cross section perpendicular to their bonded interface that the crystal structure of the second semiconductor structure in a cross section perpendicular to their bonded interface differs from that of the first semiconductor structure or that the lattice order of the second semiconductor structure is not equivalent to that of the first semiconductor structure. The semiconductor structure refers to a semiconductor substrate or a semiconductor substrate formed with semiconductor layers.

In the first method of this invention, as shown in FIG. 1, a semiconductor device B, with a different lattice constant from that of a semiconductor substrate A, is fabricated on the semiconductor substrate A by direct bonding. The semiconductors each have a face centered cubic lattice as a unit lattice. The semiconductors used are assumed to be compound semiconductors of III–V or II–VI group, and marking ○ represents atoms of III or II group and ● represents atoms of V or VI group. The semiconductor substrate A may, for example, be GaAs and the bottom layer of the semiconductor device B may be InP. When this structure is viewed in one cross section perpendicular to their bonded interface, the sequence of arrangement of the ○ atoms and ● atoms in the semiconductor substrate A is opposite to that of the semiconductor device B, in other words, the semiconductor substrate and the semiconductor device differ in the arrangement of the ○ atoms and ● atoms. This phenomenon is expressed by the expression that "the crystal structures of the semiconductor substrate A and the semiconductor device B differ from each other," or that "the lattice orders of the semiconductor substrate A and the semiconductor device B are not equivalent." As to the crystallographic orientation, the crystallographic orientation [011] of the semiconductor device B is parallel to the crystallographic orientation [011] of the semiconductor substrate A, but the crystallographic orientations [100] and [0–11] of the semiconductor device B are 180 degrees opposite to the crystallographic orientations [100] and [0–11] of the semiconductor substrate A respectively. The "–" symbol of –1 of [0–11] is a substitute of overline indicating a negative side in the Miller index representation. Because in the compound semiconductor, [100] and [011] are not equivalent to [–100] and [0–11] respectively, the inversion of the sequence of lattice order mentioned above results. The lattice order similarly reverses also when the semiconductor substrate A and the semiconductor device B have their crystallographic orientations [0–11] parallel to each other and their [100] and [011] 180 degrees inverted. Such a layered structure cannot be obtained by the epitaxial growth.

In another method of this invention, the semiconductor device B is fabricated by direct bonding on a semiconductor substrate W made of a IV-group single element semiconductor which has a face centered cubic lattice as the unit lattice such as Si. This is illustrated in FIG. 2. The symbol □ in the figure represents a IV-group atom. In a cross section perpendicular to their bonded interface, the arrangement of the IV-group atoms in the semiconductor substrate W differs from that of the ○ atoms and ● atoms in the semiconductor device B. In other words, the crystal structures of the semiconductor substrate W and the semiconductor device B differ from each other, or the lattice orders of the semiconductor substrate W and the semiconductor device B are not equivalent. Such a layered structure cannot be produced by the epitaxial growth. Moreover, unlike compound semiconductors, Si cannot be cleaved along the {011} plane, so that it is normally difficult to fabricate the {011} cleaved facets plane of a compound semiconductor when a (100) compound semiconductor is formed on a (100) Si substrate. It is especially difficult to make a light emitting device that emits light from an end surface. This structure, however, has the cleavage planes of Si and the compound semiconductor aligned with each other and thus allows the cleavage plane of the compound semiconductor device to be formed easily.

With the conventional method, on the contrary, the semiconductor device S is fabricated on the semiconductor substrate A by direct bonding, as shown in FIG. 5. In any cross section perpendicular to their bonded interface, the crystal structure of the semiconductor substrate A and the crystal structure of the bottom layer of the semiconductor device S are equal, or the lattice order of the semiconductor substrate A and the lattice order of the semiconductor device S are equivalent. That is, the semiconductor device S and the semiconductor substrate A have the same arrangement of the ○ atoms and ● atoms. Here, even if the materials are different, for example, with the semiconductor substrate A being formed of a II–VI group and the semiconductor device S a III–V group, the II-group atoms and the III-group atoms generally do not bond, nor do the V-group atoms and the VI-group atoms. In other words, the ○ atoms themselves do not bond with each other, nor do the ● atoms. The II-group atoms and the III-group atoms, and also the V-group atoms and the VI-group atoms are regarded as being equivalent in the lattice order. Here, the crystallographic orientation [100] of the semiconductor device S is 180 degrees opposite to the crystallographic orientation [100] of the semiconductor substrate A, and the crystallographic orientation [011] and [0–11] of the semiconductor device S are shifted 90 degrees from the crystallographic orientation [011] and [0–11] of the semiconductor substrate A, respectively. As a result, their atomic arrangements are equal. Generally, when the semiconductor device S is fabricated by epitaxial growth, the crystallographic orientation of the semiconductor device S is totally the same as that of the semiconductor substrate A. As described above, the conventional method has a constraint in that the crystallographic orientation of the semiconductor device S is limited by that of the semiconductor substrate A in order to make the crystal structures equal. However, when the semiconductor substrate A and the semiconductor device S use different materials, there may occur local disturbances in the crystal structure, as caused by dislocations at the bonded interface. Here, we do not consider such local disturbances to affect the crystal structure and lattice order, but make judgment on the basis of the lattice order representative of the semiconductor structure. Differences in the size of the lattice order are also not considered.

FIG. 6 shows an example case in which the semiconductor device B or S is fabricated on a semiconductor substrate X by another conventional direct bonding method. When the number of constitutional element groups differs between the semiconductor structures as mentioned above, the judgment is made based on the shape of the lattice order, not on the sequence of lattice order. Hence, the atomic arrangement in FIG. 2 differs between the structures, but the crystal structures of the semiconductor substrate and the semiconductor layer in two cases of FIG. 6 are equal or their lattice orders are equivalent. In the semiconductor substrate X the crystallographic orientations [100] and [–100], and also [011] and [0–11] are equivalent, and the IV-group atoms can bond with both the III-group atoms and V-group atoms. Therefore, one crystallographic orientation relationship which results in nonequivalent lattice orders for the combination of the compound semiconductors, for example shown in FIG. 1, may result in equivalent lattice order for the combination of the single element semiconductor and compound semiconductor. With the conventional method, however, it is noted that there are only a few crystallographic orientation relationships between the substrate and the semiconductor layer.

FIG. 7 shows an example of another conventional method disclosed in Japan Patent Laid-Open No. 40372/1973, in which semiconductor substrates, such as Si substrates, with different crystallographic orientations are bonded together with an insulating layer of $SiO_2$ several thousand Å thick interposed between. In this case, too, the crystal structure or lattice order differ between the two substrates. However, an insulating layer of sufficient thickness is interposed, these substrates are electrically insulated from each other. Thus, an electric current cannot be passed between the two substrates, limiting the range of application as the integrated device.

FIG. 3 shows an example of one method of this invention, in which two semiconductor devices are integrated. A semiconductor device B is fabricated on a part of the semiconductor substrate A by direct bonding and a semiconductor device S is fabricated on other part of the substrate A by direct bonding or epitaxial growth. In one cross section perpendicular to a bonded interface of substrate A and device B, the lattice order of the semiconductor substrate A and the lattice order of the bottom layer of the semiconductor device B are not equivalent. In other cross section parallel to the first cross section, the lattice order of the semiconductor substrate A and the lattice order of the bottom layer of the semiconductor device S are equivalent. Hence, the lattice order of the semiconductor device B and the lattice order of the semiconductor device S, when compared in these cross sections, are not equivalent. In this way, it is possible to fabricate a plurality of semiconductor layers having nonequivalent lattice orders onto one and the same semiconductor substrate. Such an integration has so far not been possible.

FIG. 4 shows a further example in which two semiconductor devices are integrated by a further method of this invention. In this case, a semiconductor device B is fabricated by direct bonding on one part of the semiconductor substrate A and a semiconductor device C onto another part of the substrate. In a cross section perpendicular to a bonded interface of substrate A and device B, the lattice order of the semiconductor substrate A is not equivalent to that of the semiconductor device B. In another cross section parallel to the first cross section, too, the lattice order of the semiconductor substrate A is not equivalent to that of the bottom layer of the semiconductor device C. Further, the lattice arrangements of the semiconductor device B and the semiconductor device C are not equivalent. In this way, devices with various lattice orders can be integrated on one and the same substrate. Because the characteristics and the manufacture process of the light emitting devices are easily affected by the lattice order, a degree of freedom of device design is considered to be significantly improved especially for integrated devices including light emitting devices.

DESCRIPTION OF THE PREFERRED EMBODIMENTS

Some embodiments of the semiconductor device and the method of manufacture thereof according to this invention will be described in detail by referring to FIGS. 8 to 23.

(Embodiment 1)

By referring to FIGS. 8 to 10, the first embodiment of the semiconductor device and the method of manufacture thereof is explained.

Figure 8A:
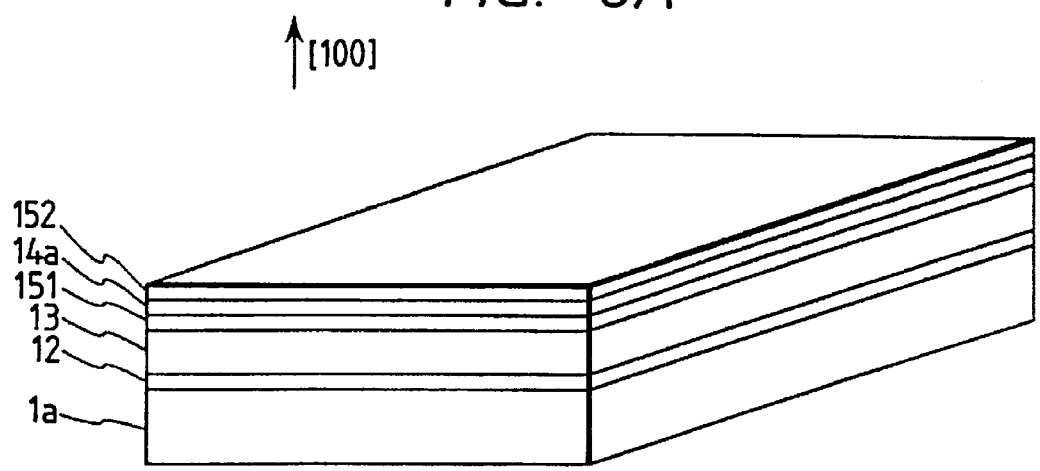
FIGS. 8A to 10B are schematic views showing a semiconductor device manufacturing process as one embodiment of this invention.
Figure 8B:
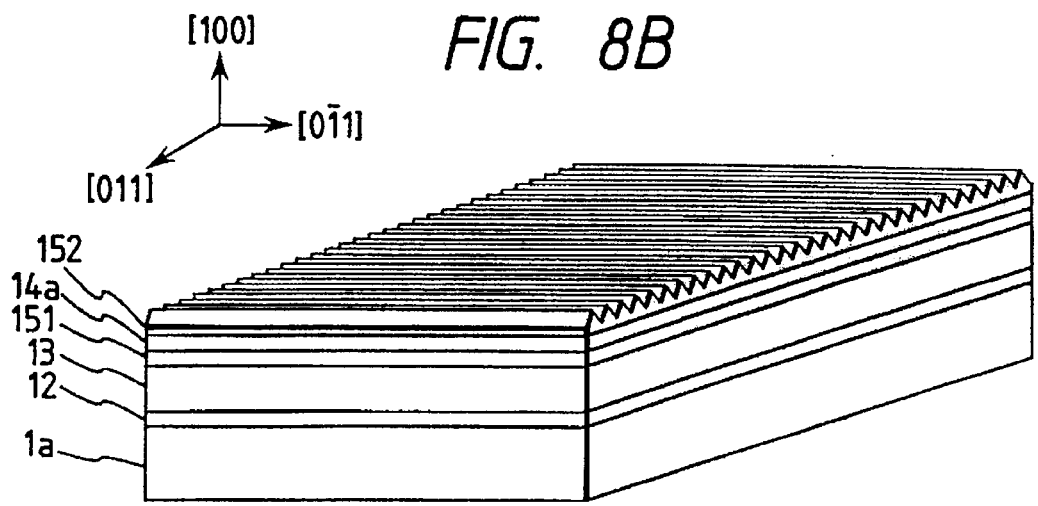
Figure 9A:
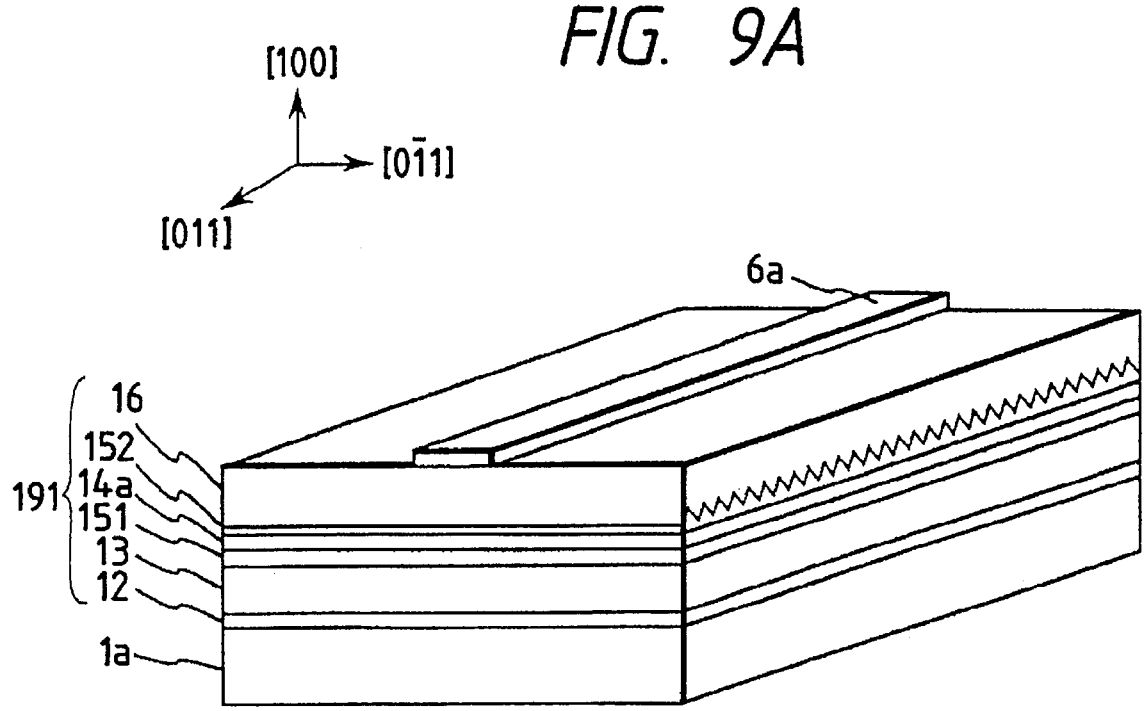
Figure 9B:
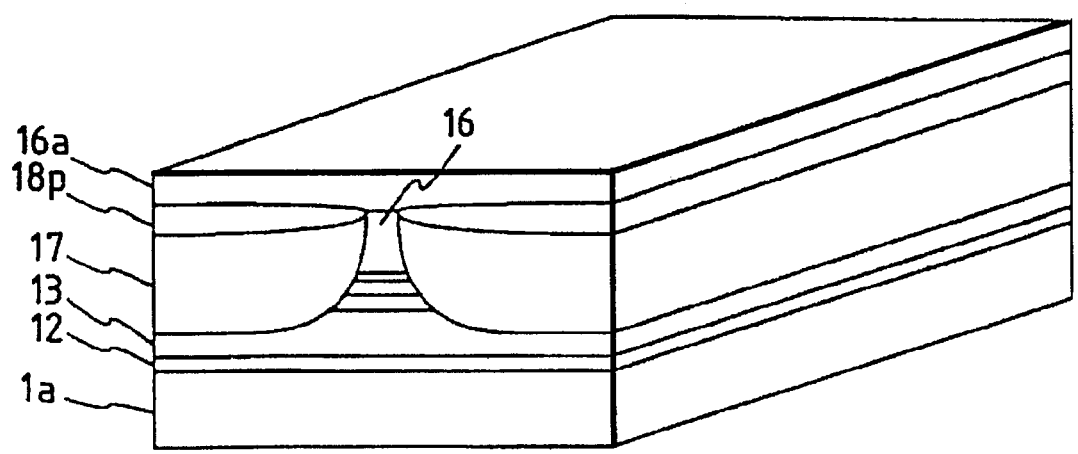

As shown in FIG. 8A, successively grown on a (100) p-InP substrate 1a by a metal organic chemical vapor deposition (MOCVD) are a p$^+$-InGaAsP contact layer 12 (0.2 μm thick), a p-InP layer 13 (1.5 μm thick), a p-InGaAsP guide layer 151 (0.05 μm thick), an undoped multiple quantum well (MQW) active layer 14a (1.55 μm in wavelength), and an n-InGaAsP guide layer 152 (0.2 μm thick). The MQW active layer 14a consists of seven layers of InGaAs (7 nm thick each) and seven layers of InGaAsP (8 nm thick each) alternately layered. Next, on the n-InGaAsP guide layer 152 is formed a grating for a distributed feedback laser by a holographic method (FIG. 8B). The grating is formed in the direction of [0–11] of the p-InP substrate 1a. An n-InP layer 16 (1.5 μm thick) is grown over the n-InGaAsP guide layer 152 (FIG. 9A). These layers 12, 13, 151, 14a, 152, 16 form a distributed feedback MQW semiconductor laser structure 191 of a long wavelength range. Next, an SiO$_2$ stripe 6a (0.3 μm thick) is formed on the n-InP layer 16. The SiO$_2$ stripe 6a is 5.5 μm wide and formed in the direction of [011]. This is etched with a liquid mixture consisting mainly of hydrobromic acid to form a mesa structure as shown in FIG. 9B. On the sides of the mesa structure, a semi-insulating InP layer 17 (about 3.0 μm thick) and a p-InP layer 18p (0.1 μm thick) are grown by the MOCVD method. Further, the SiO$_2$ stripe 6a is etched away by a diluted HF solution, and then an n-InP smoothing layer 16a (2.0 μm thick) is grown, and a buried hetero (BH) structure is formed.

Figure 10A:
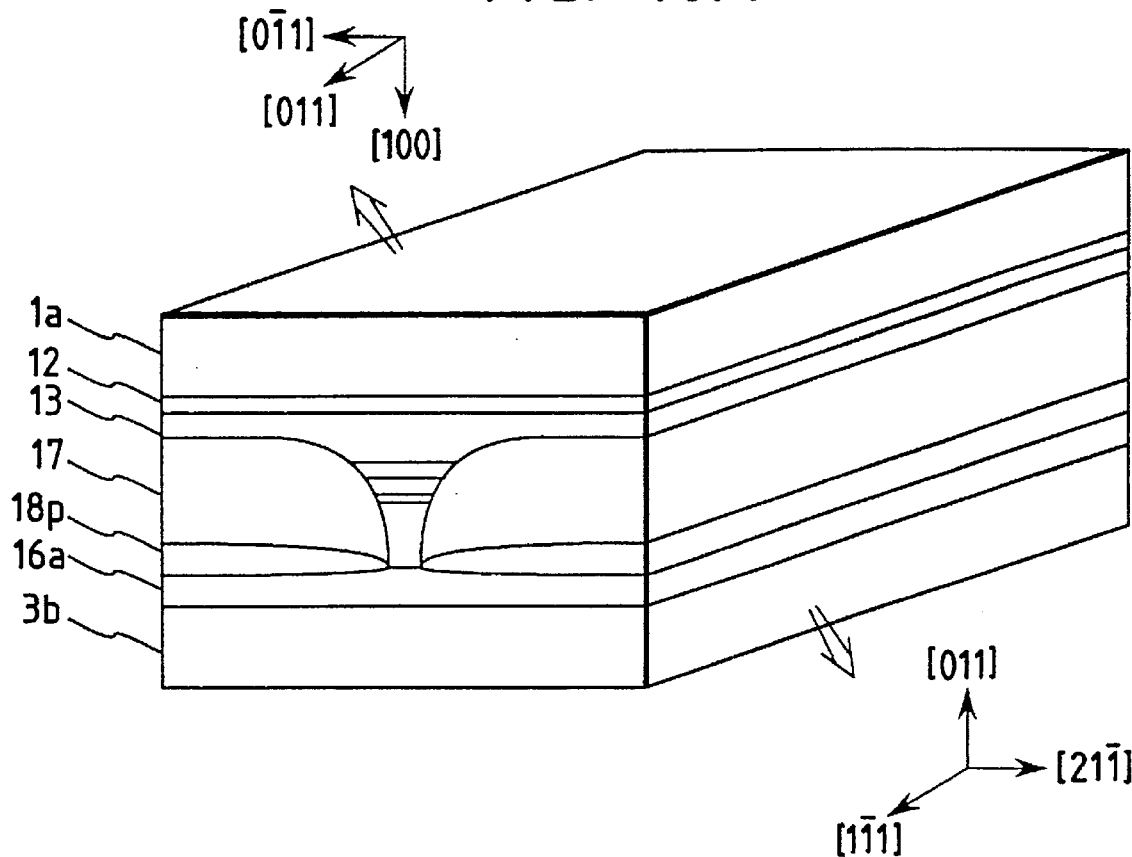

Next, the surface of the (011) n-Si substrate 3b is cleaned by a diluted HF solution and dried. The surface of the n-InP smoothing layer 16a is cleaned by a liquid mixture of sulfuric acid and hydrogen peroxide, treated with a diluted HF solution, washed with water, and spin-dried. These cleaned surfaces are placed face to face. At this time, these are so arranged that the [1–11] direction of the n-Si substrate 3b and the [011] direction of the p-InP substrate 1a are parallel. This face-to-face combined structure is placed in an anneal furnace putting a weight of about 30 g/cm$^2$ on. Either side, p-InP substrate 1a or n-Si substrate 3b, may face up. While H$_2$ gas is supplied, the temperature is increased to 650° C. where it is held for 40 minutes. In this way, the n-Si substrate 3b and the n-InP smoothing layer 16a are directly bonded together as shown in FIG. 10A.

Figure 10B:
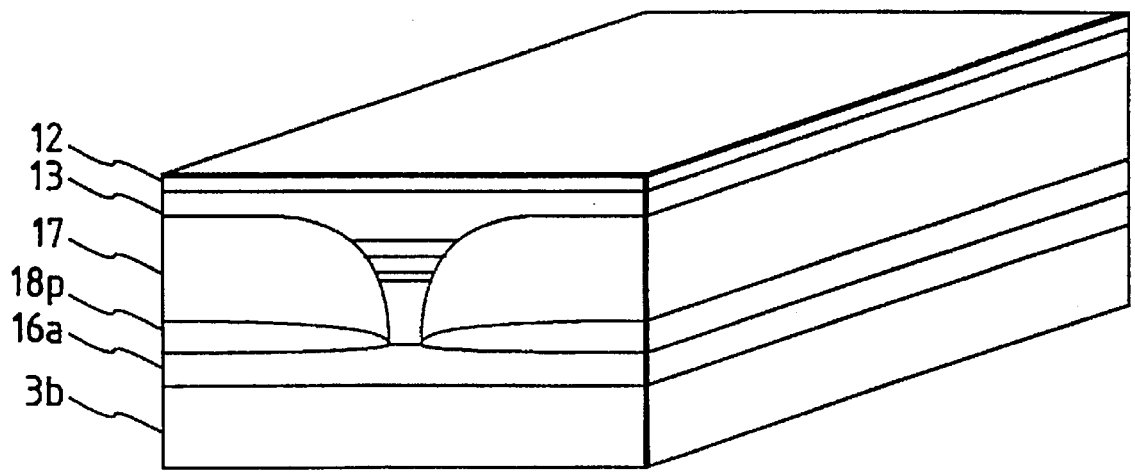

After this, the p-InP substrate 1a is etched away by a diluted hydrochloric acid solution (FIG. 10B). Etching stops at the p$^+$-InGaAsP contact layer 12. Then, through the semiconductor laser making process such as electrode formation, the semiconductor structure is cleaved along a plane aligned with the [1–11] plane of the n-Si substrate 3b and the [011] plane of the p-InP substrate 1a (not shown). As a result, an edge-emitting type distributed feedback MQW-BH semiconductor laser of a long wavelength range is fabricated on the n-Si substrate 3b by direct bonding.

Figure 2:
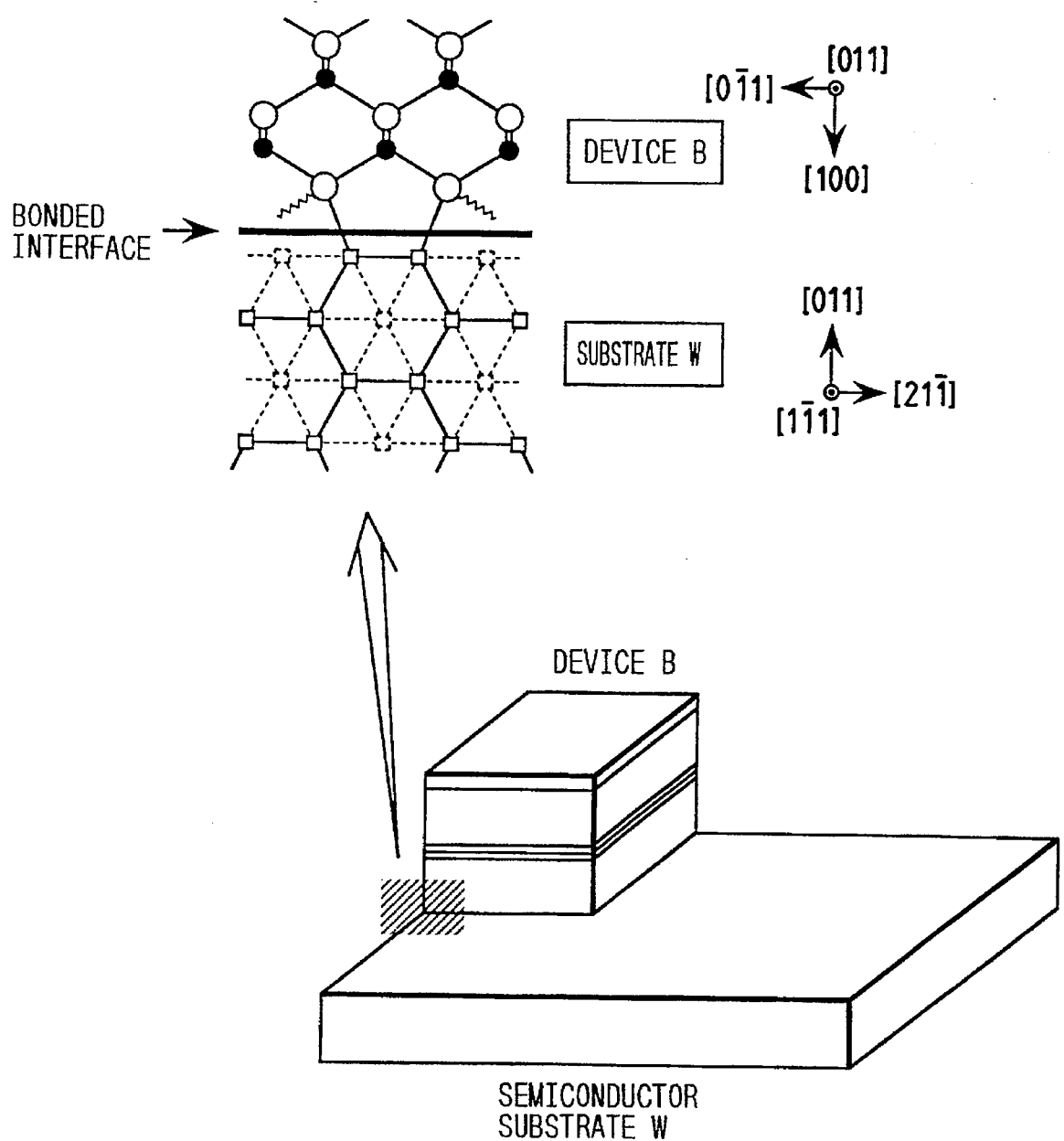
FIG. 2 is a schematic view showing a structure of another semiconductor device manufactured by a method of this invention.
Figure 3:
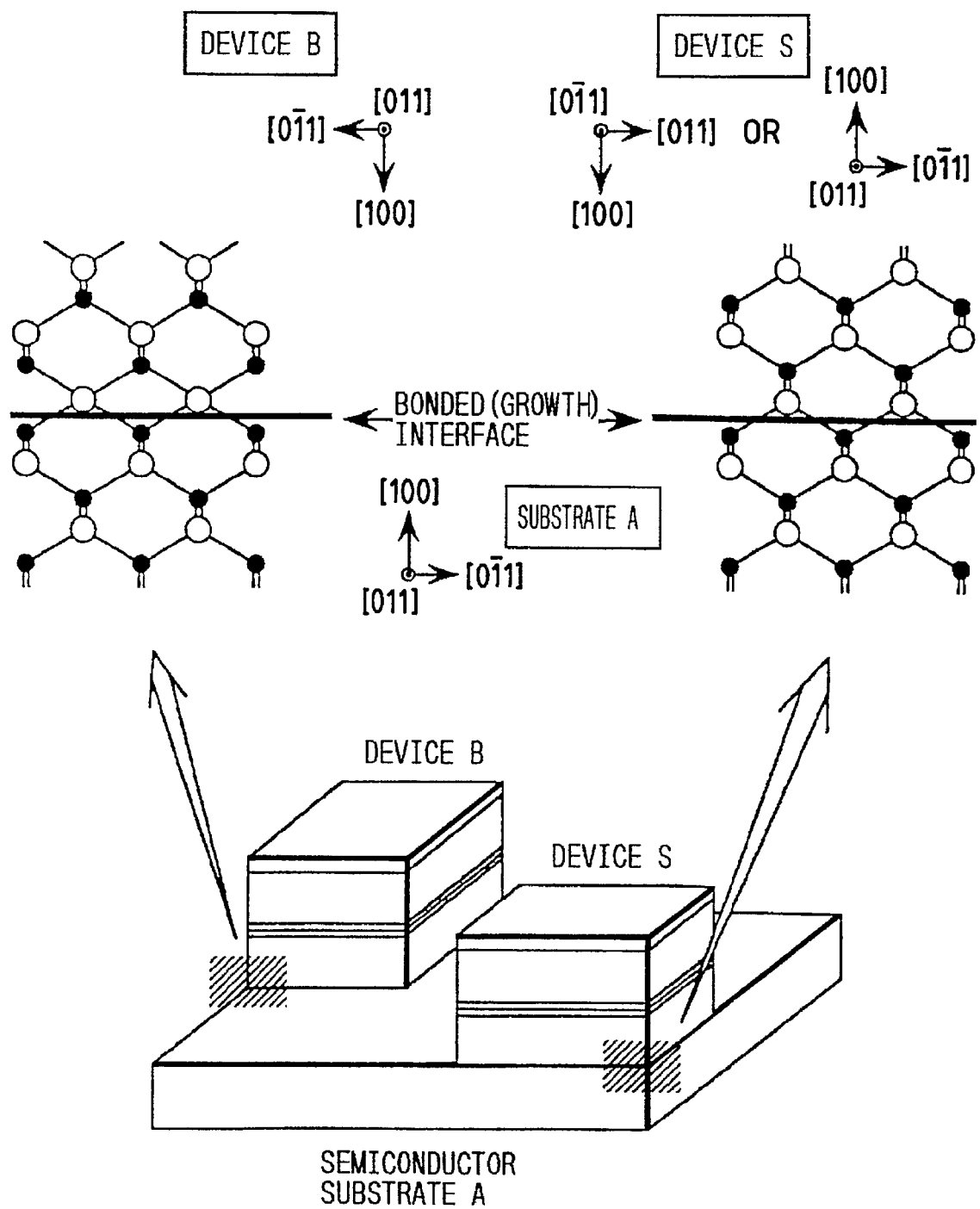
FIG. 3 is a schematic view showing a structure of an integrated semiconductor device manufactured by a method of this invention.
Figure 4:
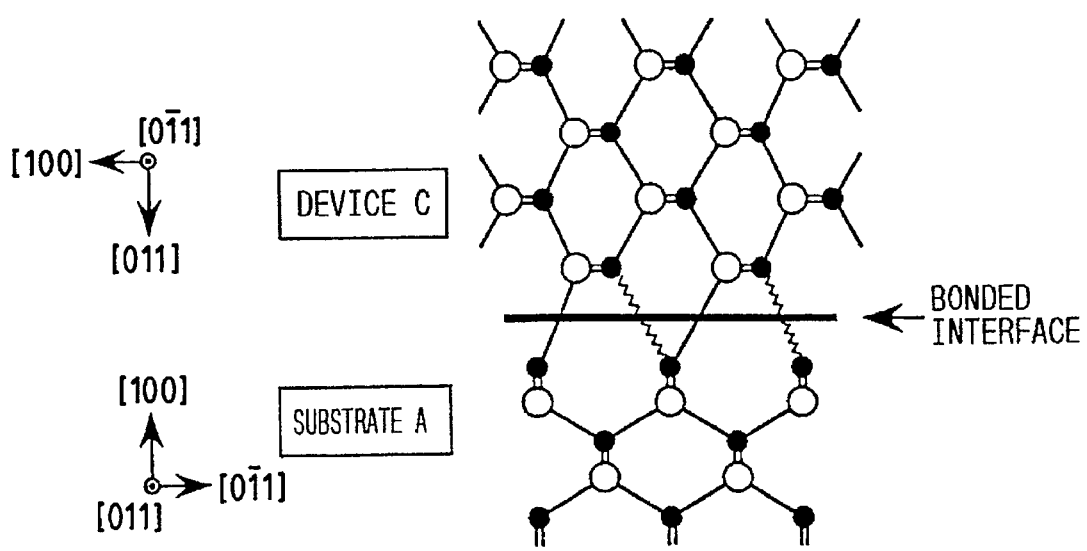
FIG. 4 is a schematic view showing a structure of another integrated semiconductor device manufactured by a method of this invention.
Figure 4:
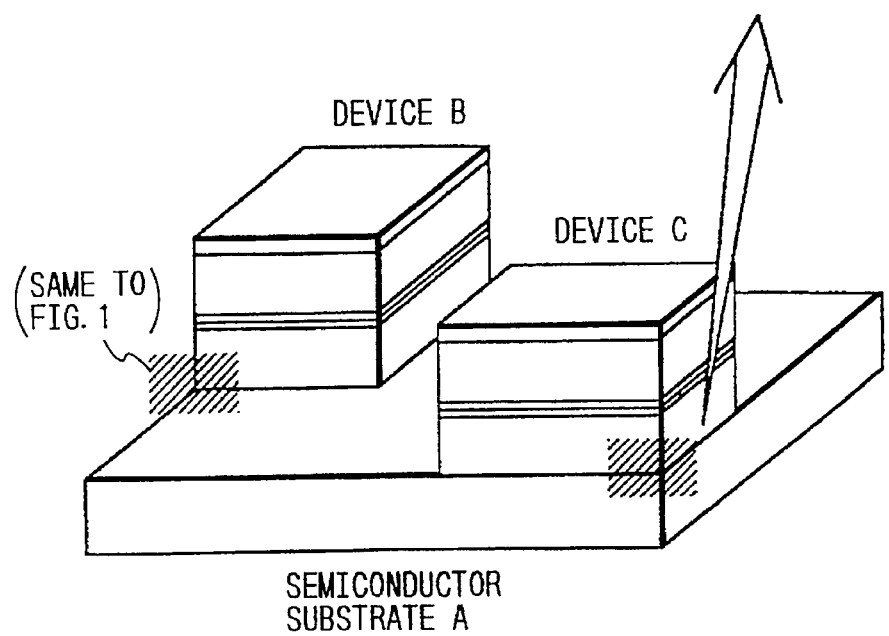
Figure 5:
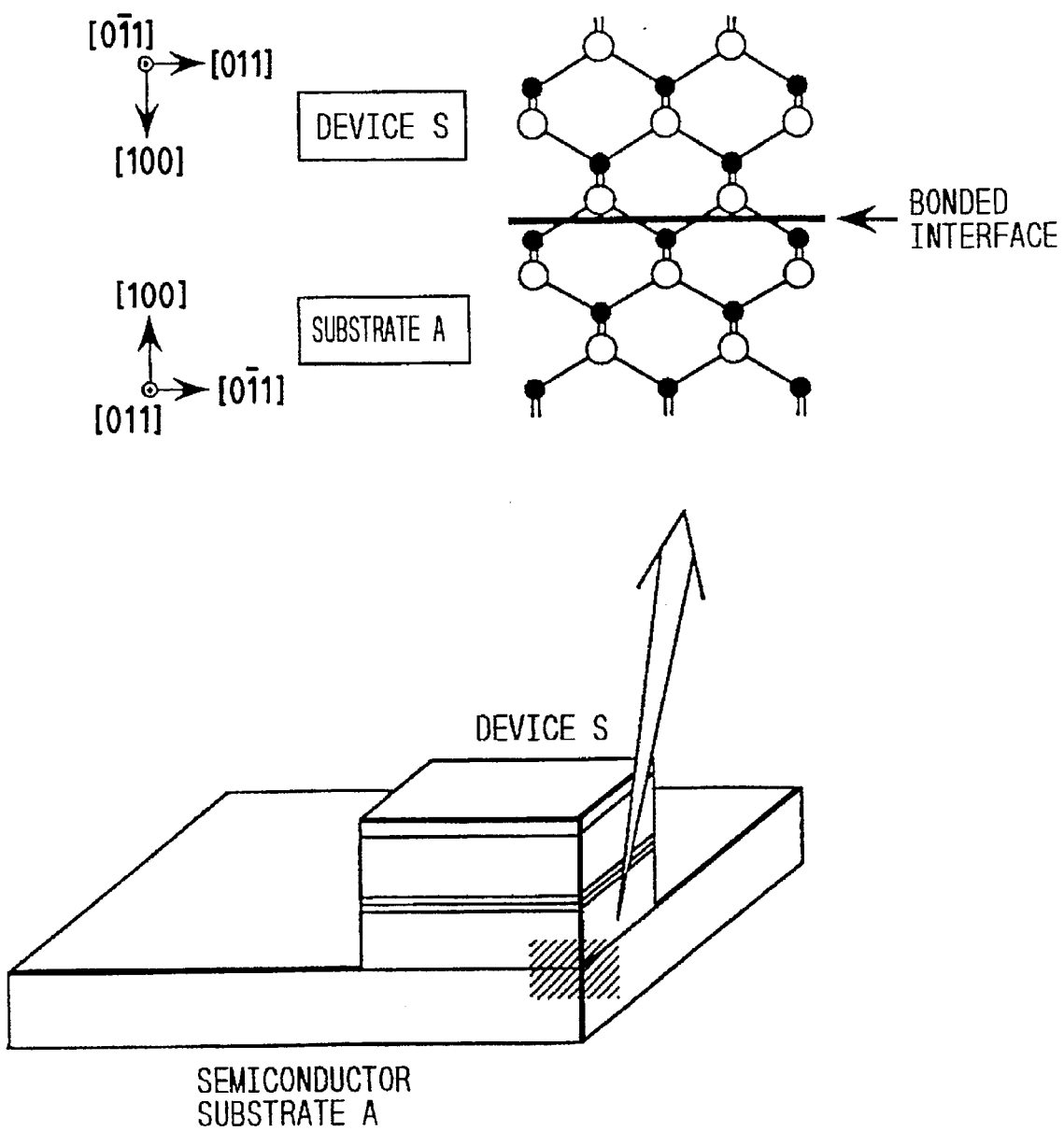
FIG. 5 is a schematic view showing a structure of a semiconductor device manufactured by a conventional method.
Figure 6:
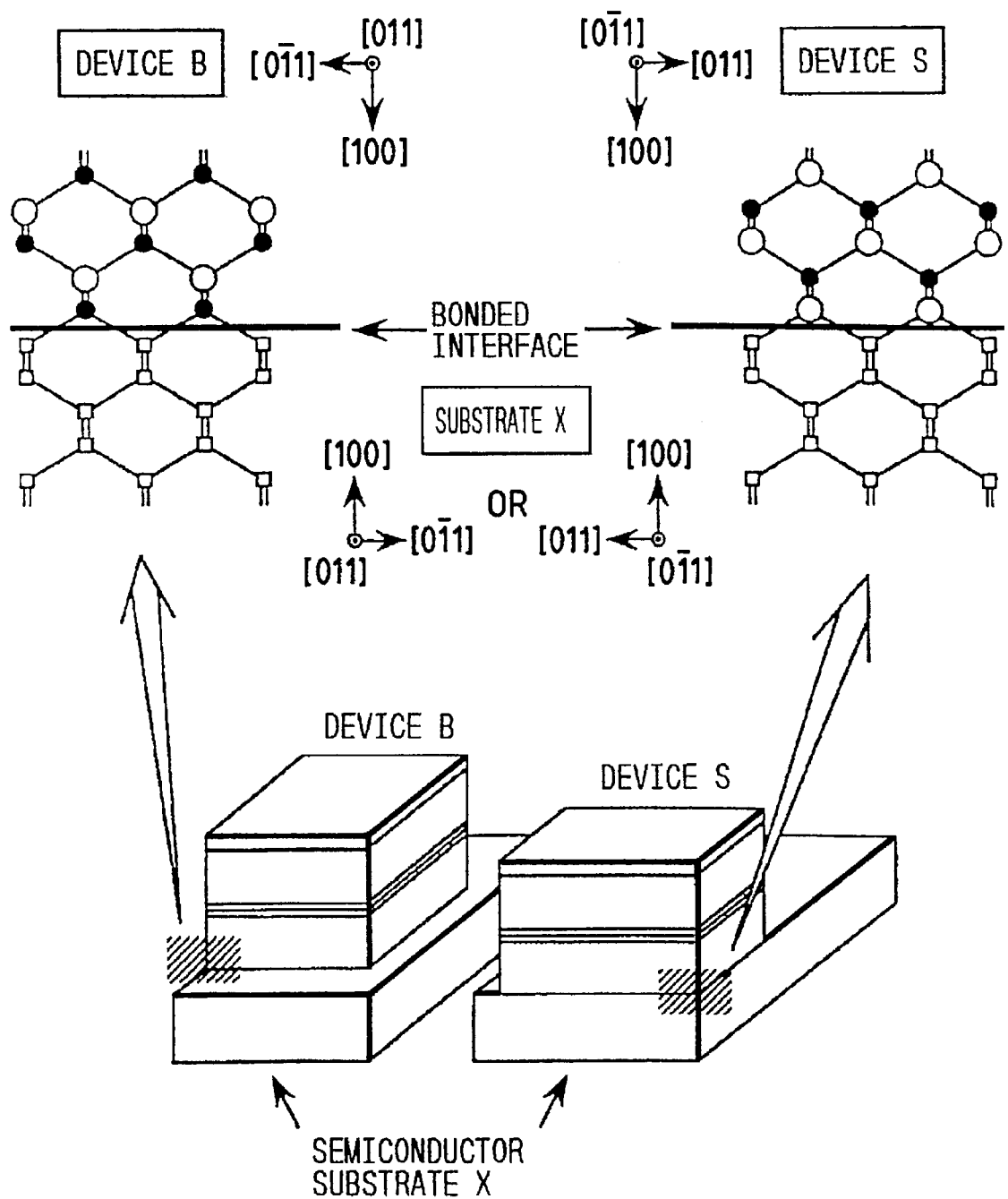
FIG. 6 is a schematic view showing a structure of another semiconductor device manufactured by a conventional method.
Figure 7:
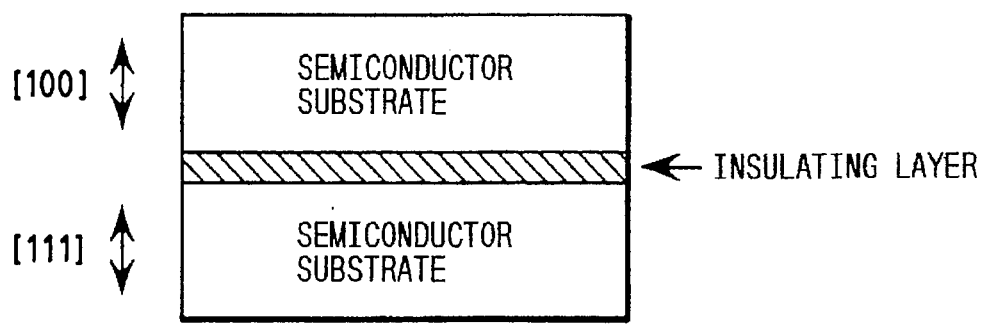
FIG. 7 is a schematic view showing a structure of another semiconductor device manufactured by a conventional method.

In this embodiment, the semiconductor laser structure and the n-Si substrate are arranged in the crystallographic orientation relationship shown in FIG. 2. When viewed in a cross section perpendicular to the direct-bonded interface, these crystal structures are different from each other, or their lattice orders are not equivalent. The semiconductor laser structure formed in this way, though it has such a discontinuous interface, has laser characteristics which are idential to those of the laser fabricated by epitaxially growing on an InP substrate. The epitaxial growth can only produce semiconductor laser structures having the same crystallographic orientation as the substrate. With the present invention, however, as described in this embodiment, it is possible to fabricate devices with a variety of crystallographic orientations without deteriorating the characteristics. Si, in particular, has a cleavage plane different from that of the compound semiconductor, so that when a compound semiconductor laser is formed on a Si substrate by epitaxial growth, it is difficult to make cleaved facets of the laser and therefore the edge-emitting type laser. This invention, however, makes it possible to make the cleavage plane of Si match that of the compound semiconductor. Besides, the grating of the distributed feedback laser can be formed only in a certain direction, so that its crystallographic orientation is limited to a specific direction. This means that the crystallographic orientation of the substrate is restricted if the epitaxial growth is employed. Such a limitation is eliminated by the invention.

InP, which mainly constitutes the semiconductor laser structure, and Si of the substrate have greatly different lattice constants and thermal expansion coefficients. With this embodiment, however, the characteristics of the semiconductor laser are identical to those of the laser fabricated on the InP substrate. This is explained as follows. As mentioned in the Applied Physics Letters, 58 1961 (1991), although dislocations generate at the direct-bonded interface to relieve the difference in physical property constant, the amount of dislocations is small and they are not likely, by nature, to propagate into the laser structure. Hence, the effect of the dislocations on the device characteristics is considered small. With this invention, therefore, it is possible to fabricate a variety of devices on a substrate of a kind different from the devices in arbitrary crystallographic orientations.

While this embodiment directly bonds the semiconductor laser onto the substrate after the BH structure has been formed, it is possible to form the BH structure after directly bonding the semiconductor laser structure. In the direct bonding of the n-Si substrate 3b and the n-InP layer 16a, it is important that the surface of the n-InP layer 16a be smooth. Although this can be achieved by the MOCVD method, the growth conditions must be optimized. When circumstances, such as using other epitaxial growth methods, make it difficult for the surface of the n-InP layer 16a to be smooth, the n-InP layer 16a may be grown somewhat thicker than specified and its surface mirror-polished. In this case, it is necessary to slightly etch the polished surface prior to direct bonding to remove a layer distorted by polishing. While this embodiment sets the width of the $SiO_2$ stripe 6a to 5.5 μm, the width is not limited to this value. The stripe 6a may be formed of any material as long as it produces the similar effect.

This embodiment concerns a case where a distributed feedback MQW semiconductor BH laser of a long wavelength range having the wavelength of 1.55 μm is fabricated on the Si substrate. This invention can also be applied to the manufacture of a variety of devices, which include lasers whose active layer has an unstrained or strained quantum well structure, DH lasers without a grating, lasers of other wavelength ranges such as short-wavelength lasers formed mainly of GaAs, and other various devices such as light detecting devices and transistors. The devices may be formed in array, rather than as single devices. Depending on the kind of devices to be manufactured, this invention can also be applied to other combinations of substrate and semiconductor structure to be directly bonded together. Further, the crystallographic orientation relation between the device and the substrate, the procedures and conditions of the direct bonding, and the epitaxial growth process are not limited to those of this embodiment as long as they do not depart from the spirit of this embodiment.

(Embodiment 2) By referring to FIG. 11, the second embodiment of the semiconductor device and the method of manufacture thereof is described.

Figure 11A:
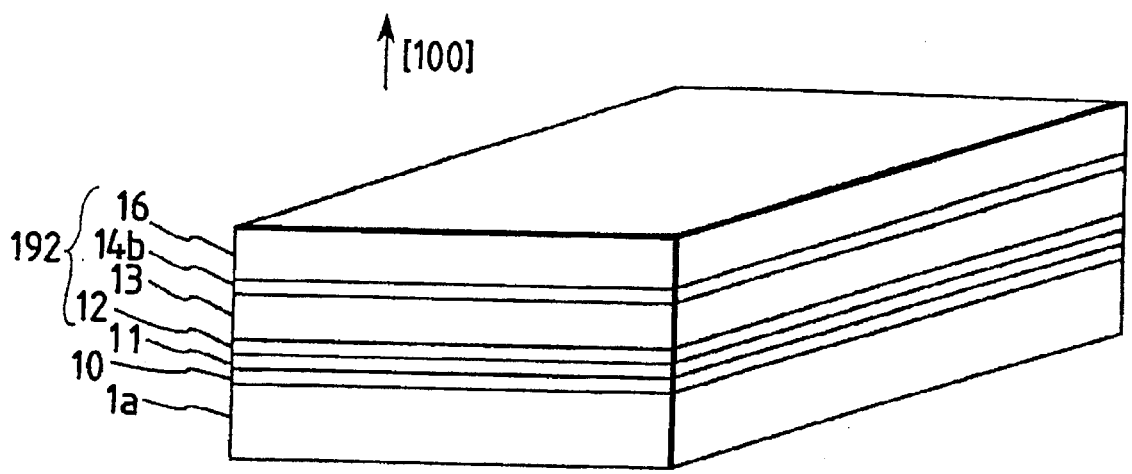
FIGS. 11A–11B are schematic views showing a semiconductor device manufacturing process as another embodiment of this invention.

As shown in FIG. 11A, successively grown on a (100) p-InP substrate 1a by an MOCVD method are a p- or undoped InGaAs etching stop layer 10 (0.2 μm thick), a p- or undoped InP second etching stop layer 11 (0.2 μm thick), a $p^+$-InGaAsP contact layer 12, a p-InP layer 13, an undoped InGaAsP active layer 14b (0.14 μm thick, 1.55 μm in wavelength), and an n-InP layer 16. These layers 12, 13, 14b, 16 form a Fabry-Perot semiconductor DH (Double Hetero) laser structure 192 of a long wavelength range.

Figure 11B:
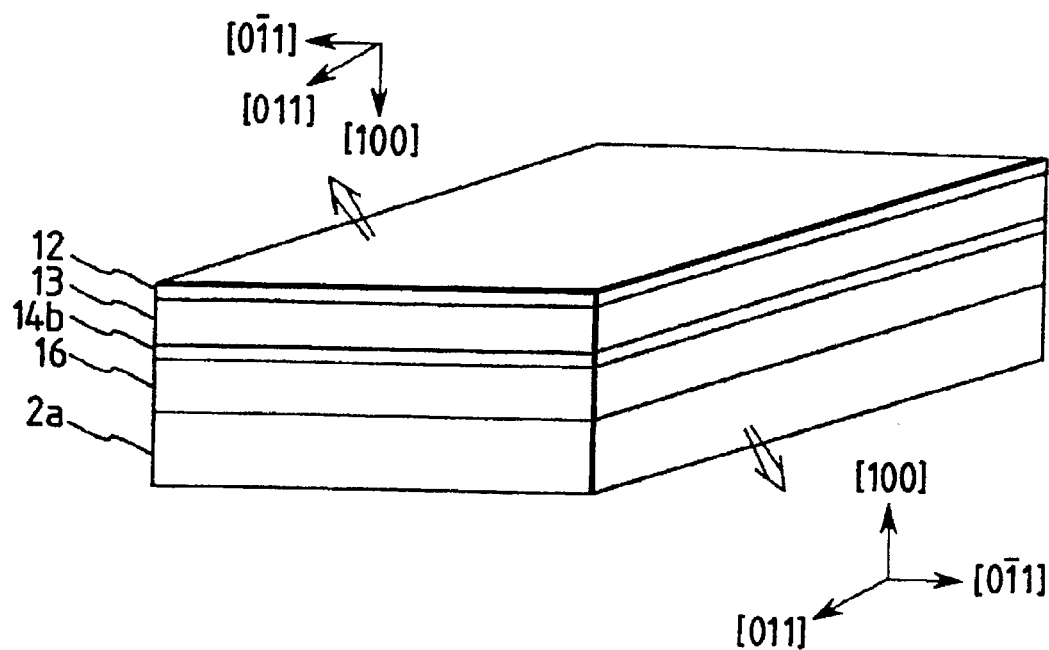

Next, the surfaces of a (100) n-GaAs substrate 2a and n-InP layer 16a are cleaned with a liquid mixture of sulfuric acid and hydrogen peroxide, treated with an diluted HF solution, and washed with water, after which they are spin-dried. These cleaned surfaces are placed face to face. They are directly bonded together in the same way as the first embodiment. The bonding is done by heating the combined structure to 650° C. at which it is held for 30 minutes. At this time, these are so arranged that the [011] direction of the n-GaAs substrate 2a and the [011] direction of the p-InP substrate 1a are paralel. Then, the p-InP substrate 1a is etched away by a diluted hydrochloric acid solution. Etching stops at the InGaAs etching stop layer 10. At this time, the n-GaAs substrate 2a is not etched. Further, the InGaAs etching stop layer 10 is etched away by a liquid mixture of sulfuric acid and hydrogen peroxide and then the InP second etching stop layer 11 is also etched away by a diluted hydrochloric acid solution (FIG. 11B). Through the semiconductor laser making process (not shown) such as electrode formation, the Fabry-Perot semiconductor DH laser of a long wavelength range is fabricated on the n-GaAs substrate 2a by direct bonding.

Figure 1:
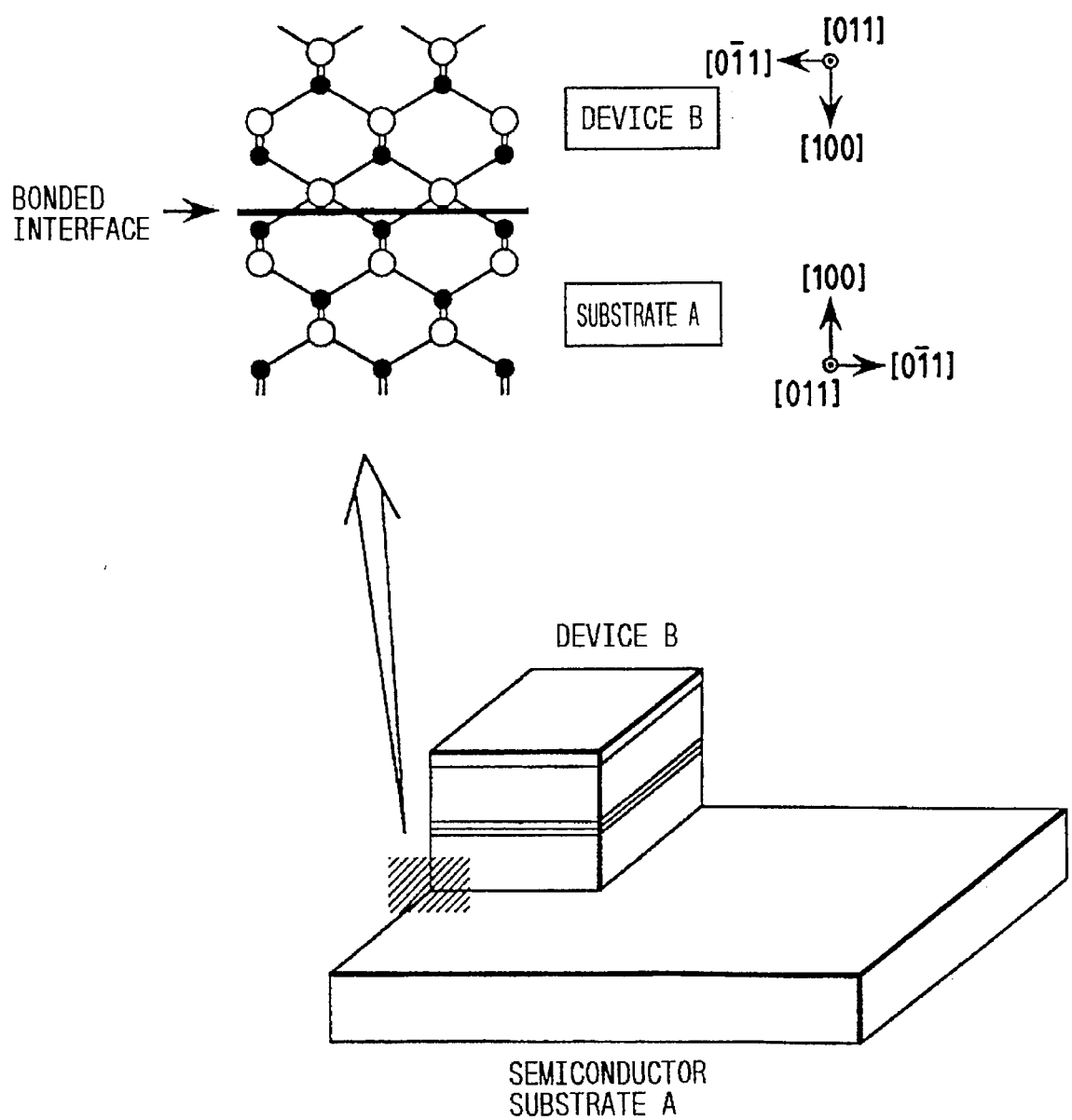
FIG. 1 is a schematic view showing a structure of a semiconductor device manufactured by a method of this invention.

In this embodiment, the semiconductor laser structure and the n-GaAs substrate are arranged in the crystallographic orientation relation of FIG. 1, and their crystal structures differ from each other in a cross section perpendicular to the direct-bonded interface or their lattice orders are not equivalent. As mentioned in the Embodiment 1, however, this does not degrade the device characteristics. Further, as with the first embodiment, the difference in the lattice constant and thermal expansion coefficient between the InP, which mainly constitutes the semiconductor laser structure, and the GaAs of the substrate does not result in deteriorated characteristics of the semiconductor laser.

Unlike the first embodiment, the second embodiment provides an InGaAsP etching stop layer between the p-InP substrate and the $p^+$-InGaAsP contact layer. This is because if the $p^+$-InGaAsP contact layer is employed as the etching stop layer like in the first embodiment, the surface of the contact layer may be damaged during the etching of the thick substrate. To prevent this, a separate etching stop layer is provided. Hence, if the surface of the contact layer is not severely affected by etching, the $p^+$-InGaAsP contact layer may be used as the etching stop layer as in the first embodiment.

This second embodiment concerns a case of fabricating a Fabry-Perot semiconductor DH laser of a long wavelength range with the wavelength of 1.55 μm. This invention, however, can be applied to manufacturing a variety of devices and lasers with different kinds of active layers. While this embodiment has described a case of fabricating a semiconductor laser of long wavelength range on a GaAs substrate, the combination of the substrate and the semiconductor structure to be directly bonded together is not limited to the combination adopted by this embodiment and appropriate combinations may be used according to the kind of device to be fabricated. The crystallographic orientation relation between the device and the substrate, the procedures and conditions of direct bonding, and the epitaxial growth procedures are not limited to those of this embodiment.

(Embodiment 3)

By referring to FIGS. 12 to 17, the third embodiment of the semiconductor device and the method of manufacture thereof is explained.

Figure 12A:
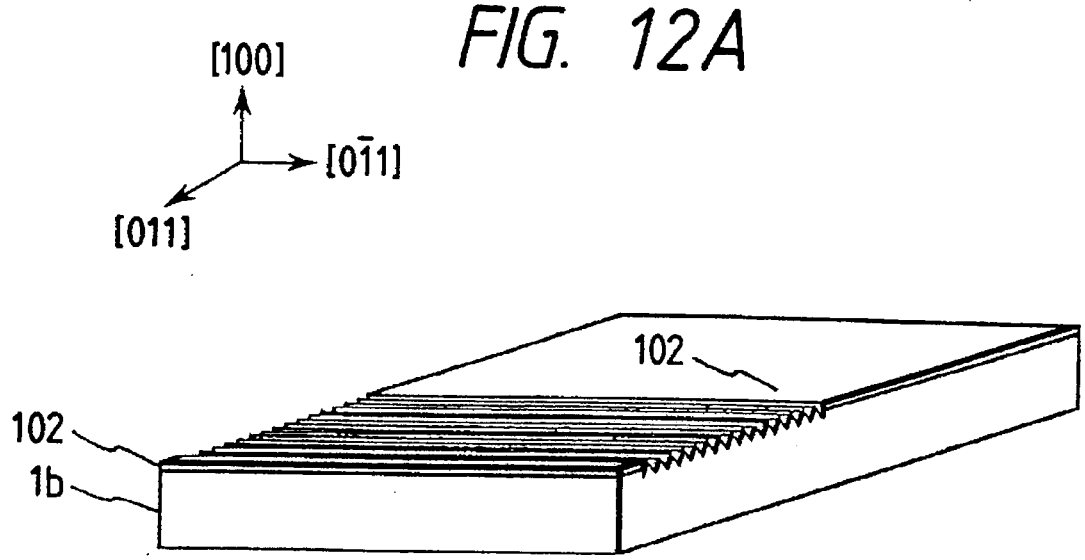
FIGS. 12A to 17B are schematic views showing a semiconductor device manufacturing process as one embodiment of this invention as applied to fabrication of an integrated device.
Figure 12B:
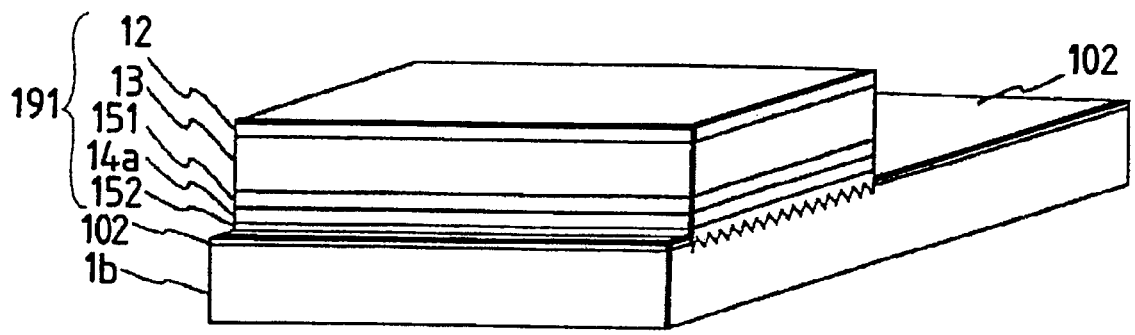

As shown in FIG. 12A, an $SiO_2$ stripe film 102 (0.3 μm thick) is vapor-deposited on a (100) n-InP substrate 1b. The $SiO_2$ strip film 102 is formed in the [0–11] direction over the width of 1000 μm at intervals of 2000 μm. On those parts of the n-InP substrate 1b where the $SiO_2$ strip films 102 are not formed, the gratings for the distributed feedback laser are parallelly formed in the [0–11] direction. On this structure are successively grown an n-InGaAsP guide layer 152, an undoped MQW active layer 14a, a p-InGaAsP guide layer 151, a p-InP layer 13, and a $p^+$-InGaAsP contact layer 12 (FIG. 12B) by the MOCVD method. Growth occurs only on the diffraction grating. In this way, a distributed feedback MQW semiconductor laser structure 191 of a long wavelength range is selectively grown and formed on the n-InP substrate 1b. After this, the $SiO_2$ strip films 102 are etched away by a diluted HF solution and the n-InP substrate 1b is etched by 0.4 μm. A dielectric multiple layer 92 that lowers light reflection factor is vapor-deposited on one of the (011) side planes of the semiconductor laser structure 191 and an $SiO_2$ end-surface protection film 109 (0.5 μm thick) on the other (011) plane. Further, an $SiO_2$ surface protection film 103 (0.2 μm thick) is vapor-deposited on the $p^+$-InGaAsP contact layer 12, the dielectric multiple layer 92, and the $SiO_2$ end-surface protection film 109, and an $SiO_2$ protection film 101 (0.5 μm thick) on the back of the n-InP substrate 1b.

Figure 13A:
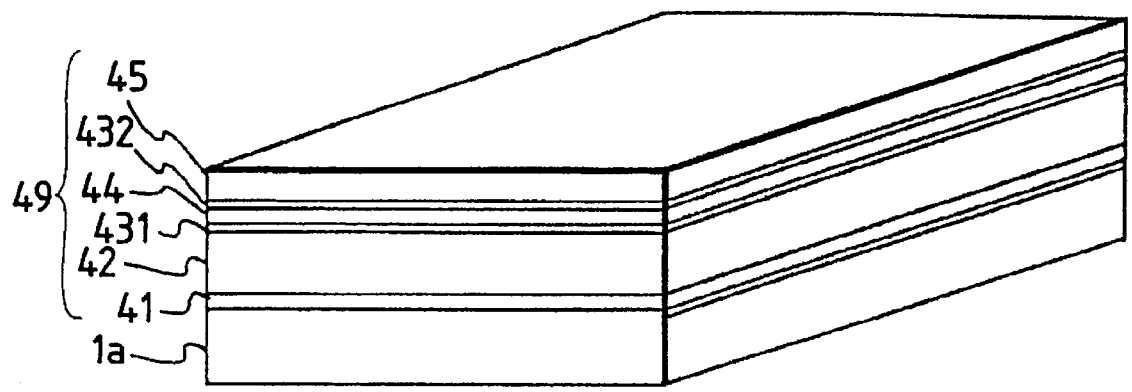

Next, as shown in FIG. 13A, grown by the molecular beam epitaxy (MBE) on the (100) p-InP substrate 1a are a p-InGaAs contact layer 41 (0.2 μm thick), a p-InAlAs clad layer 42 (1.5 μm thick), a undoped super-lattice upper guide layer 431, an undoped multiple quantum well (MQW) absorption layer 44, and a undoped super-lattice lower guide layer 432, and an n-InAlAs clad layer 45 (0.5 μm thick). The MQW absorption layer 44 consists of 30 layers of InGaAs (6.5 nm thick each) and 30 layers of InAlAs (5 nm thick each) alternately layered. The super-lattice upper guide layer 431 and the super-lattice lower guide layer 432 each consist of three layers of InGaAs (2.5 nm thick each) and three layers of InAlAs (2.5 nm thick each) alternately layered. These layers 41, 42, 431, 44, 432, 45 form a Mach-Zehnder type optical modulator structure 49. This is divided by the (011) plane at intervals of 2000 μm. A dielectric multiple layer 92 is vapor-deposited on one of the side planes of the optical modulator structure 49, and an $SiO_2$ end-surface protection film 109 on the other plane.

Figure 13B:
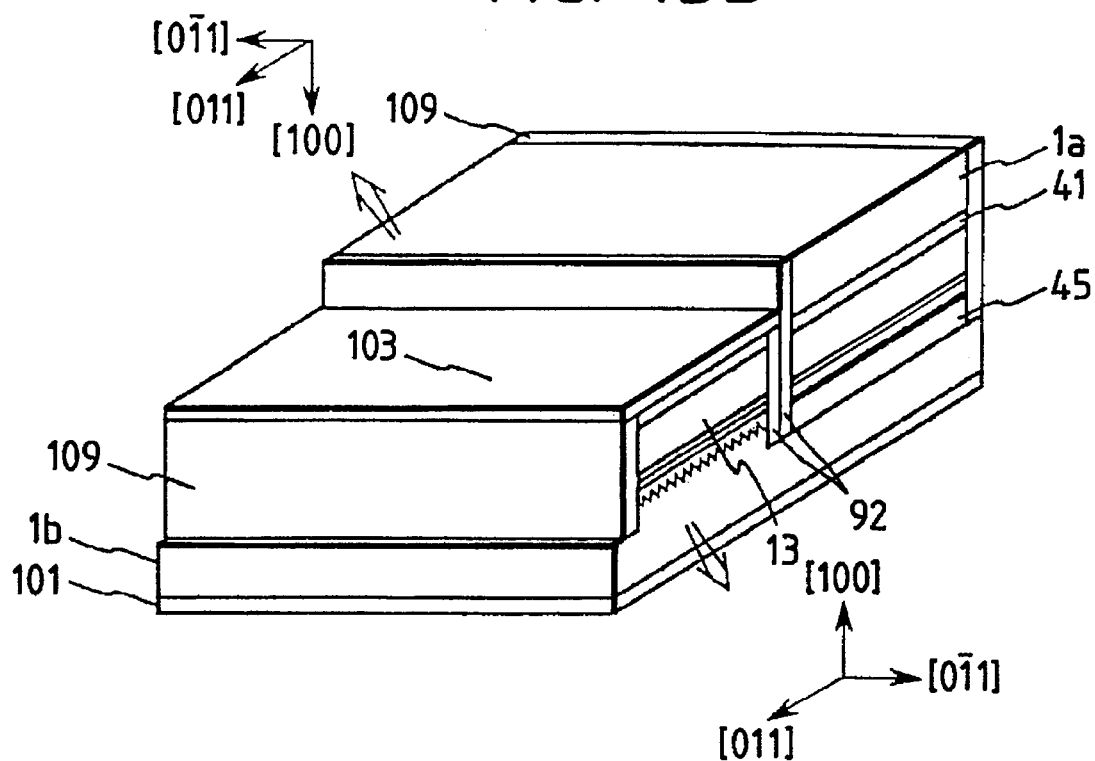

Next, the surface of the n-InP substrate 1b formed with the distributed feedback MQW semiconductor laser structure 191 is cleaned with a liquid mixture of sulfuric acid and hydrogen peroxide. The surface of the n-InAlAs clad layer 45 of the optical modulator structure 49 is cleaned with a diluted sulfuric acid solution and a liquid mixture of phosphoric acid and hydrogen peroxide, washed with water and then spin-dried. The surface of the n-InAlAs clad layer 45 is placed on the surface of the n-InP substrate 1b where the $SiO_2$ surface protection film 103 is not deposited. And they are directly bonded together in the same way as in the second embodiment (FIG. 13B). At this time, they are so arranged that the [011] direction of the (100) p-InP substrate 1a and the [011] direction of the n-InP substrate 1b are parallell, and that the cleavage plane of the optical modulator structure 49 on which the dielectric multiple layer 92 is deposited contacts the side plane of the semiconductor laser structure 191 on which with the dielectric multiple layer 92 is deposited. Then, the p-InP substrate 1a is etched away by a diluted hydrochloric acid solution, and the $SiO_2$ protection film 101, $SiO_2$ surface protection film 103 and $SiO_2$ end-surface protection film 109 are also etched away by a diluted HF solution. The p-InGaAs contact layer 41 is not etched by a diluted hydrochloric acid solution.

Figure 14A:
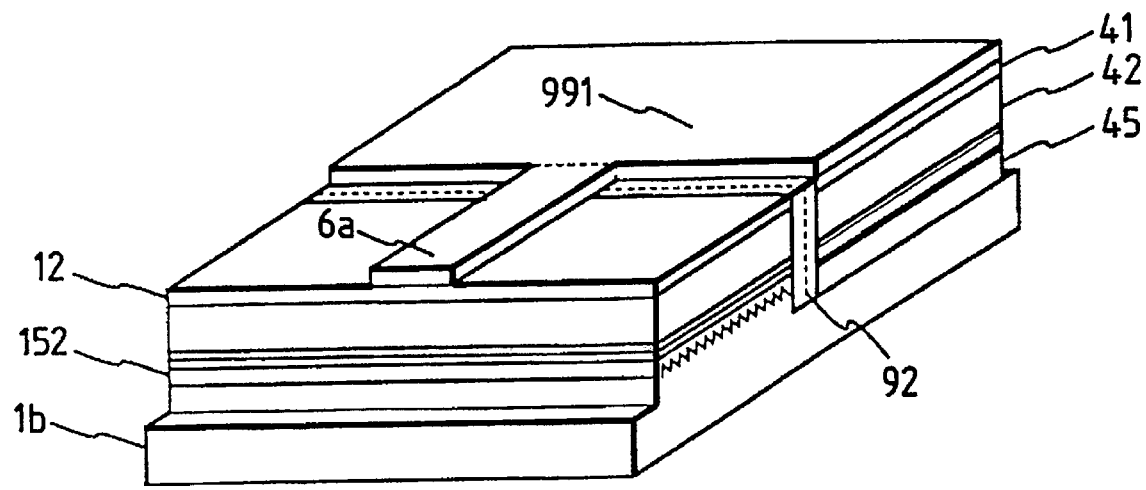
Figure 14B:
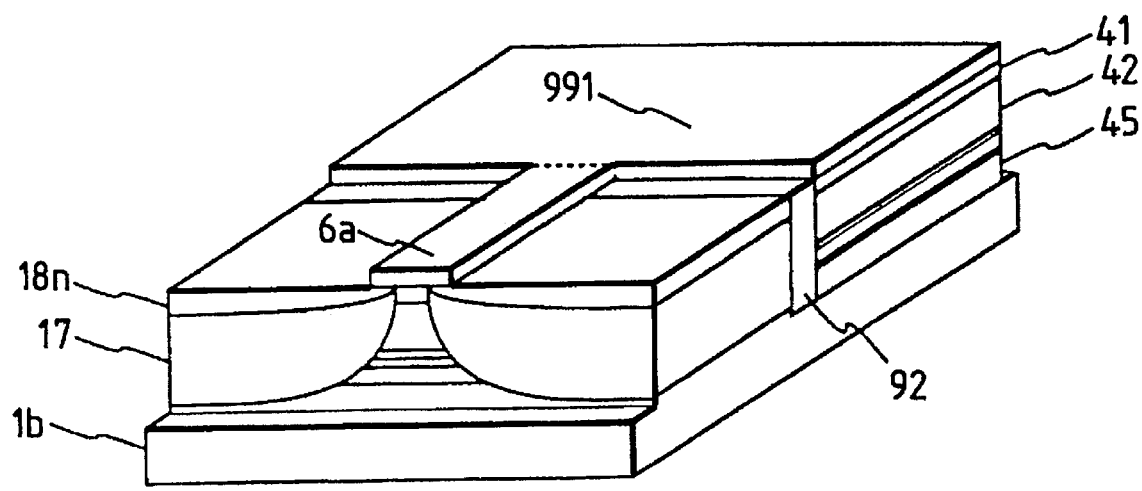
Figure 15A:
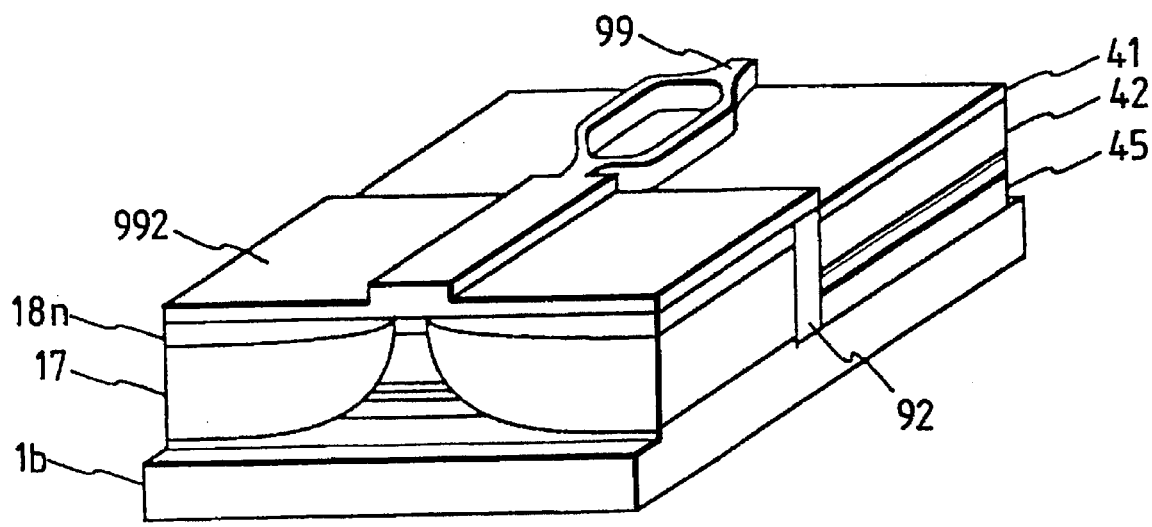
Figure 15B:
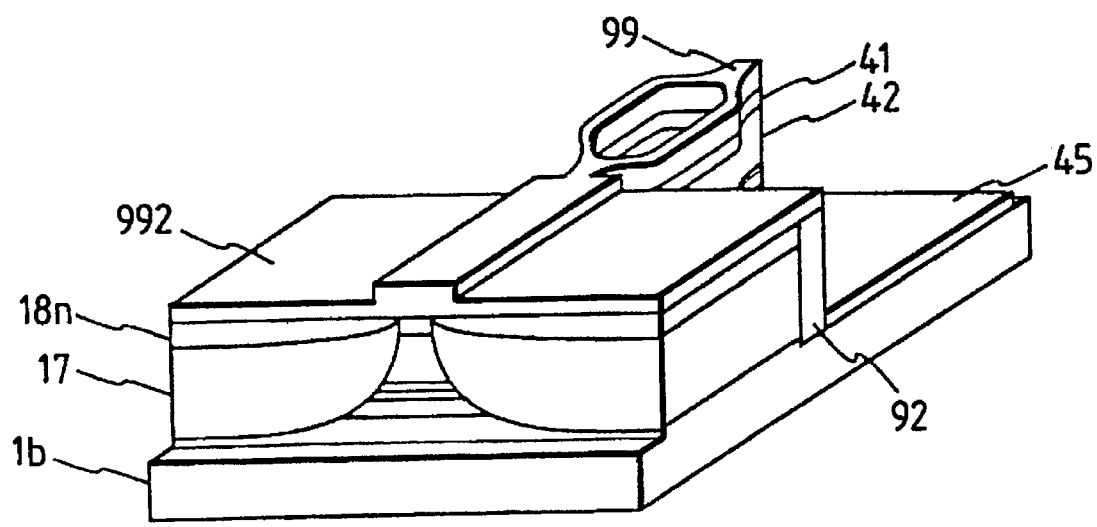
Figure 16A:
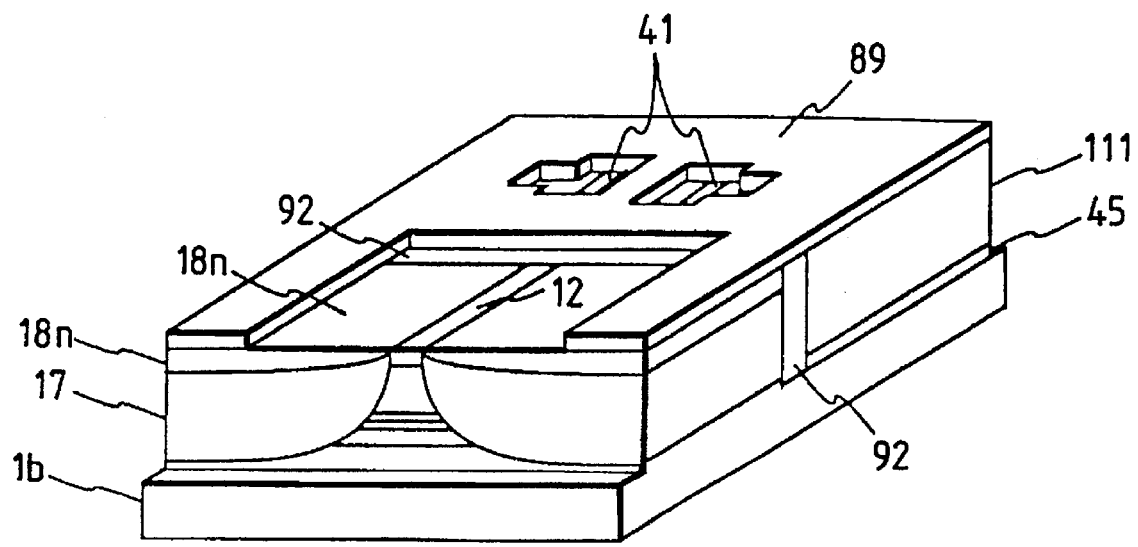
Figure 16B:
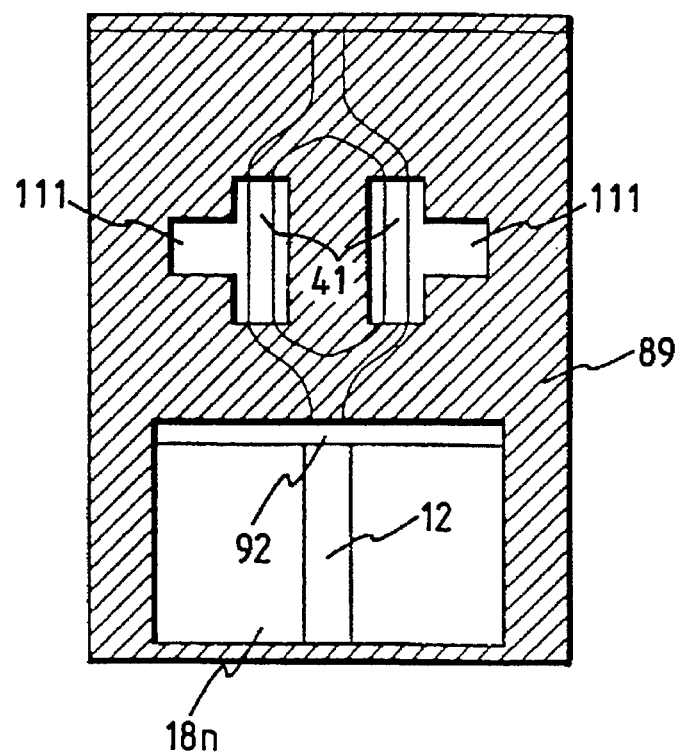
Figure 17A:
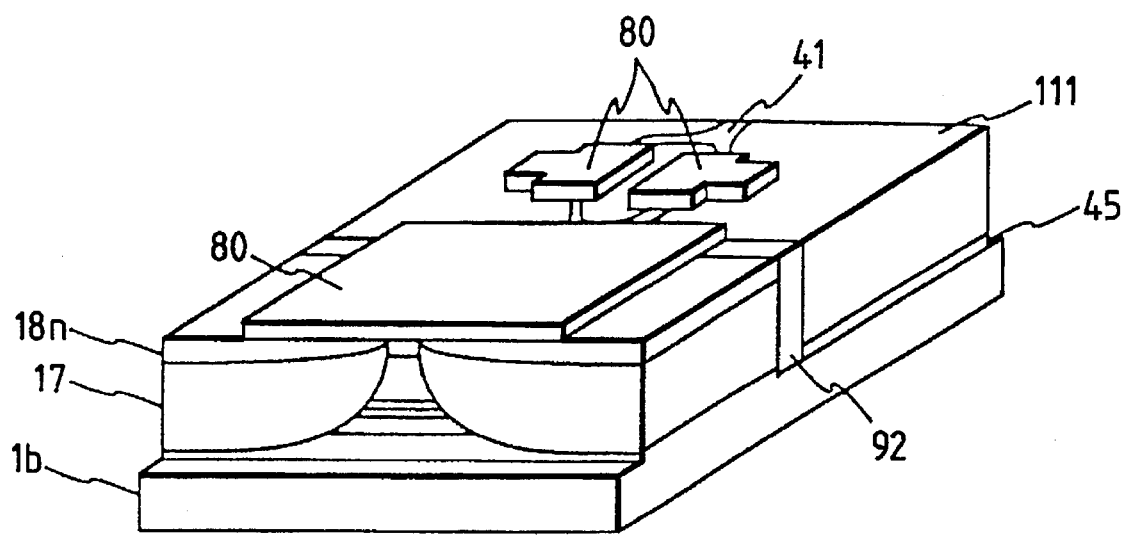

Next, an $SiO_2$ film 991 (0.3 μm thick) is deposited over the entire surface of the p-InGaAs contact layer 41 of the optical modulator structure 49 and over the dielectric multiple layer 92, and an $SiO_2$ stripe 6a is deposited over the p-InP layer 13 of the semiconductor laser structure 191 (FIG. 14A). The $SiO_2$ stripe 6a is formed parallel to the [011] direction of the semiconductor laser structure 191. With the $SiO_2$ stripes 6a as a mask, the layers of the laser structure 191 are etched with a liquid mixture consisting mainly of hydrobromic acid to form a mesa structure as in the first embodiment. On the sides of the mesa structure are grown by the MOCVD method a semi-insulating InP layer 17 and a n-InP layer 18n (0.1 μm thick) (FIG. 14B). After this, an $SiO_2$ film 992 is vapor-deposited over the entire surface of the wafer. Then the $SiO_2$ film 1.0 μm in total thickness, which was vapor-deposited over the optical modulator structure 49, is wet-etched with a photoresist as a mask and formed into an $SiO_2$ pattern 99 of FIG. 15A. This $SiO_2$ pattern is stripe-shaped, 1.5 μm wide and is formed parallel to the [0–11] direction of the optical modulator structure 49. The pattern is branched in two at an intermediate position. The center line of the $SiO_2$ pattern is aligned with the center line of the $SiO_2$ stripe 6a formed on the laser structure 191. With the $SiO_2$ pattern 99 as a mask, the layers of the optical modulator structure 49 are etched to the depth of 2.3 μm by reactive ion beam etching (RIBE) (FIG. 15B). As a result, the n-InAlAs clad layer 45 of the optical modulator structure 49 is etched to an intermediate depth according to the geometry of $SiO_2$ pattern. The portion that was etched away is filled with a polyimide 111. After the $SiO_2$ film over the wafer has been removed by etching with a diluted HF solution, a photoresist pattern 89 (2.0 μm thick) is formed (FIG. 16A). The top view of this photoresist pattern 89 is shown in FIG. 16B. A p-type electrode 80 (Cr 500 Å/Au 7000 Å/Cr 500 Å) is then formed over the wafer by vapor deposition. Then, the photoresist pattern 89 is removed by an etching liquid, leaving the electrode 80 only where the photoresist pattern 89 was not formed (FIG. 17A).

Figure 17B:
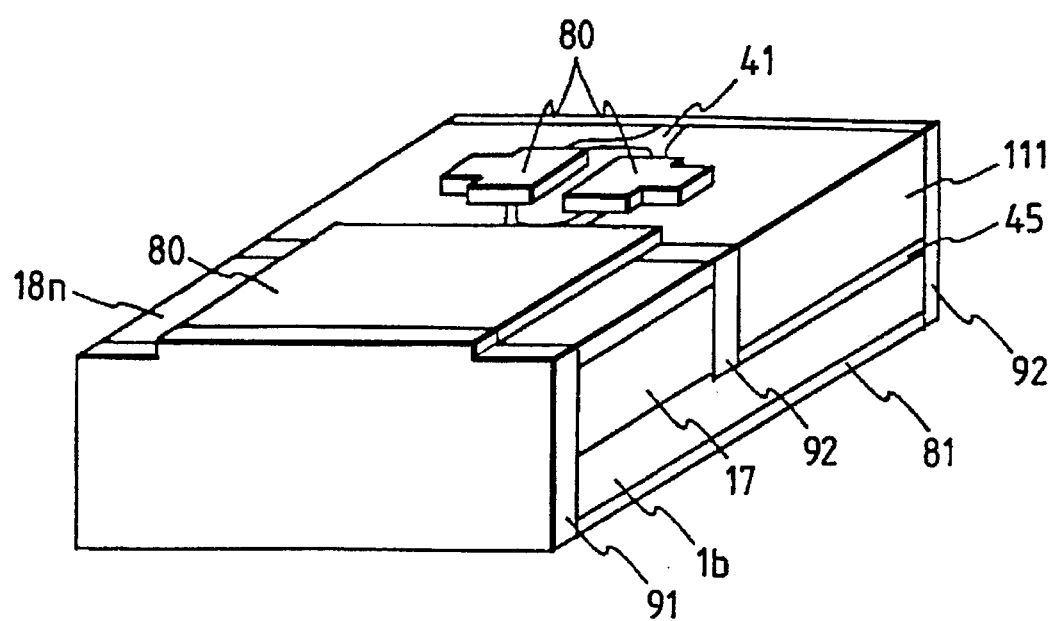

Further, the n-InP substrate 1b is polished from the back to a thickness of about 100 μm and an n-type electrode 81 (Ti 1000 Å/Pt 2000 Å/Ti 1000 Å) is deposited on the entire back-surface. This is cleaved to a length of 2000 μm in such a way that, of 2000 μm, 600 μm is covered by the semiconductor laser structure 191 and 1400 μm by the optical modulator structure 49. In the last step, a dielectric multiple film 91 for enhancing the light reflection factor is vapor-deposited on the cleavage plane on the semiconductor laser side and a dielectric multiple film 92 is vapor-deposited on the cleavage plane on the optical modulator side (FIG. 17B). In this way, the Mach-Zehnder type optical modulator and the distributed feedback MQW semiconductor laser of a long wavelength range are fabricated and integrated on the InP substrate.

In this embodiment, because the semiconductor laser structure is epitaxially grown on the n-InP substrate, the crystallographic orientation of the semiconductor laser is the same as that of the substrate. It is noted, however, that the optical modulator structure and the n-InP substrate are arranged in the crystallographic orientation relation of FIG. 1, so that in a cross section perpendicular to the direct-bonded interface, their crystal structures differ from each other or their lattice orders are not equivalent. The characteristics of the optical modulator are idential to those of the optical modulator fabricated by epitaxial growth. In this integrated device, the output of the semiconductor laser is modulated according to the voltage that is applied to the optical modulator while the semiconductor laser is being driven by a certain voltage. The Mach-Zehnder type optical modulator modulates the output of the semiconductor laser by utilizing changes in refractive index. Here, because the refractive index change caused by the quantum confined Stark effect in the multiple quantum well and the refractive index change caused by the electro-refractive effect need to have equal polarities, an optical waveguide must be formed in the direction of [0–11] when it is to be formed on the (100) semiconductor structure and in the direction of [011] when it is to be formed on the (−100) semiconductor structure. Because the distributed feedback semiconductor laser, as mentioned in the first embodiment, can only form the grating in one fixed direction, the direction of the optical waveguide that should be perpendicular to the direction of the grating is also restricted. In more concrete terms, the optical waveguide can only be formed in the [011] direction when it is formed on the (100) semiconductor structure. That is, on the (100) semiconductor structure, the optical waveguide directions of the Mach-Zehnder type optical modulator and the distributed feedback semiconductor laser do not agree, so that it has been impossible to integrate them on the same substrate by epitaxial growth such as demonstrated in the Microwave and Optical Technology Letters, 7/3 132 (1994). With this invention, however, because the crystal structures of the substrate and the device need not be continuous as described above, it is possible to integrate them in such a way that their optical waveguide directions agree as in this embodiment.

Because the optical modulator and the semiconductor laser are electrically isolated, no cross-talk occurs between them. The optical waveguide is formed after the optical modulator structure has been directly bonded onto the substrate, so that there is no deviation in optical coupling between the optical modulator and the semiconductor laser. That is, when the optical modulator and the semiconductor laser are formed on separate substrates before being integrated, the positions of the devices must be aligned with high precision. Otherwise, there is an optical loss when light emitted from the semiconductor laser enters the optical modulator. As to the fabrication method that bonds the optical modulator structure to the n-InP substrate 1b by using adhesives, rather than directly bonding it, before fabricating the device, this method is considered not feasible because various acid solutions used during the process of device fabrication deteriorates the bonding force of the adhesives.

While this embodiment fabricates the optical modulator by direct bonding onto the substrate on which the semiconductor laser has been partially grown and integrating them, it is also possible to directly bond the semiconductor laser onto the substrate on which the optical modulator has been partially grown, or to directly bond and integrate both the semiconductor laser and the optical modulator onto another substrate. For example, when they are to be integrated with electronic devices such as transistors, they can be directly bonded and integrated onto the Si substrate. In these cases, the fabrication of the semiconductor laser by direct bonding conforms to Embodiment 1 and Embodiment 2. While this embodiment partially fabricates the semiconductor laser structure 191 on the n-InP substrate 1b by selective growth, it is possible to grow the semiconductor laser structure 191 over the entire surface of the n-InP substrate 1b and then remove a part of it by etching to partially fabricate the laser structure. The materials of the protective film 101, stripe film 102, surface protection film 103 and end-surface protection film 109 are not limited to $SiO_2$, and any appropriate materials may be used as long as they produce the same effect.

Although this embodiment integrates the distributed feedback MQW semiconductor laser of a long wavelength range having a wavelength of 1.55 μm, this invention can also be applied to the integration of lasers of other wavelength ranges. The device length and stripe width of the semiconductor laser and the optical modulator are not limited to those of this embodiment. Further, the materials of the optical modulator and the semiconductor laser are also not limited to those of this invention. Although this embodiment has described the case of integrating a combination of the semiconductor laser and the optical modulator, the embodiment can also be applied to a case of integrating a combination of other devices. The number and kind of devices to be integrated may be other than those of this invention, and three or more kinds of devices may be integrated. This embodiment may further include a light detecting device among elements integrated by direct bonding. Depending on the devices to be integrated, the combination of substrate and semiconductor structure to be directly bonded is not limited to that of this embodiment. Nor are the crystallographic orientation relation between the device and the substrate, the procedures and conditions of direct bonding and the epitaxial growth process.

(Embodiment 4)

By referring to FIGS. 18 to 23, the fourth embodiment of the semiconductor device and the method of manufacture thereof according to this invention is explained.

Figure 18A:
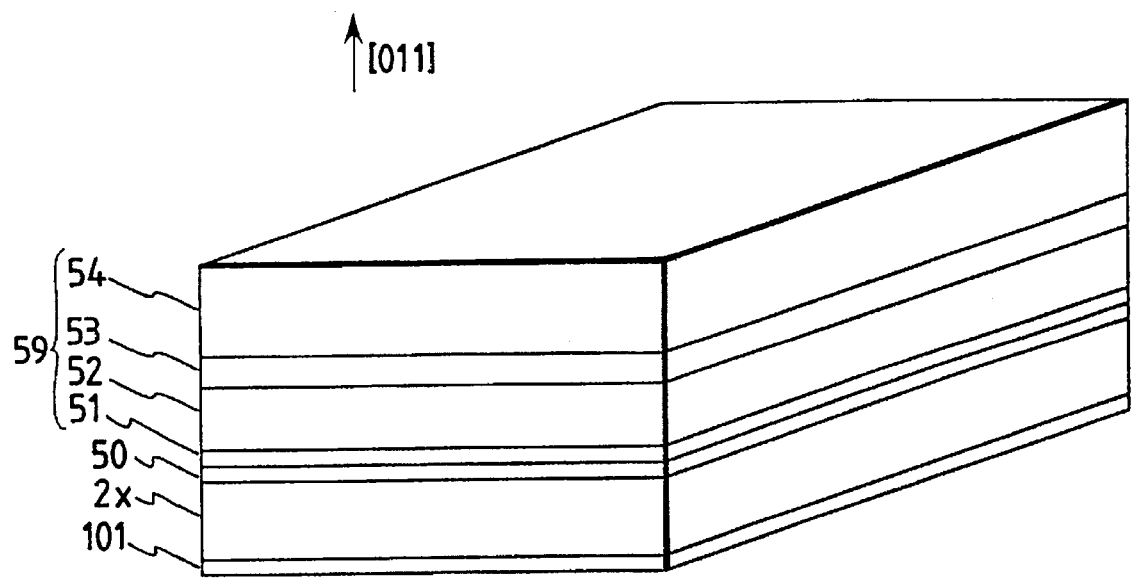
FIGS. 18A to 23B are schematic cross sections showing a semiconductor device manufacturing process as another embodiment of this invention as applied to fabrication of an integrated device.

As shown in FIG. 18A, over a (011) n-GaAs substrate 2x are grown successively by the MOCVD method an n- or undoped InGaP etch stop layer 50 (0.2 μm thick), an i-(n-)GaAs cap layer 51 (0.05 μm thick), an i-(n-)Al$_{03}$Ga$_{07}$As layer 52 (2 μm thick), an i-(n-)GaAs core layer 53 (1 μm thick), and an i-(n-)Al$_{03}$Ga$_{07}$As layer 54 (3 μm thick). These layers 51–54 form an optical frequency converter structure 59 of rotating phase-plate type. The n-GaAs substrate 2x is polished from the back to a thickness of about 100 μm and then vapor-deposited with an $SiO_2$ film 101. This is cleaved along the (0–11) plane, a cleavage plane of GaAs perpendicular to the (011) plane, at intervals of 2000 μm. The both cleavage planes are deposited with an $SiO_2$ end-surface protection film 109 (0.2 μm thick).

Figure 18B:
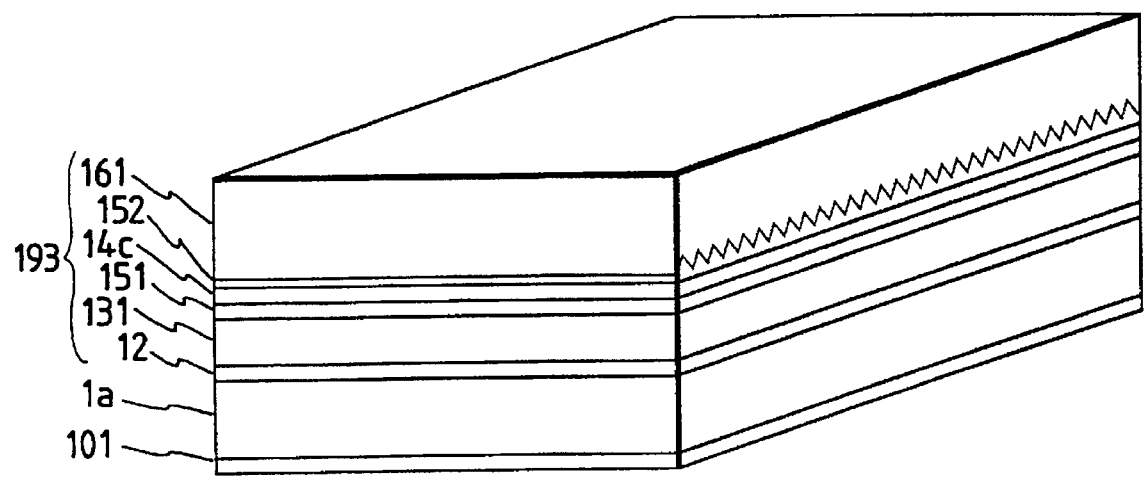

Next, as shown in FIG. 18B, over a (100) p-InP substrate 1a are successively grown by the MOCVD method a p$^+$-InGaAsP contact layer 12, a p-InP layer 131 (2 μm thick), a p-InGaAsP guide layer 151, an undoped MQW active layer 14c (1.3 μm in wavelength), and an n-InGaAsP guide layer 152. The MQW active layer 14c consists of five layers of InGaAsP (6 nm thick each) and five layers of InGaAsP with different composition than the former (10 nm thick each) alternately layered. Next, over the n-InGaAsP guide layer 152 a grating is formed parallel to the [0–11] direction. And an n-InP layer 161 (3.5 μm thick) is grown on this wafer.

These layers 12, 131, 151, 14b, 152, 161 form a distributed feedback MQW semiconductor laser structure 193 of a long wavelength range. Then, the p-InP substrate 1a is polished from the back to a thickness of about 100 µm and deposited with an SiO₂ film 101. The semiconductor structure thus formed is cleaved along the (011) plane at 500 µm intervals. An SiO₂ end-surface protection film 109 is deposited on one of the cleavage planes and a dielectric multiple film 92 on the other.

Figure 19A:
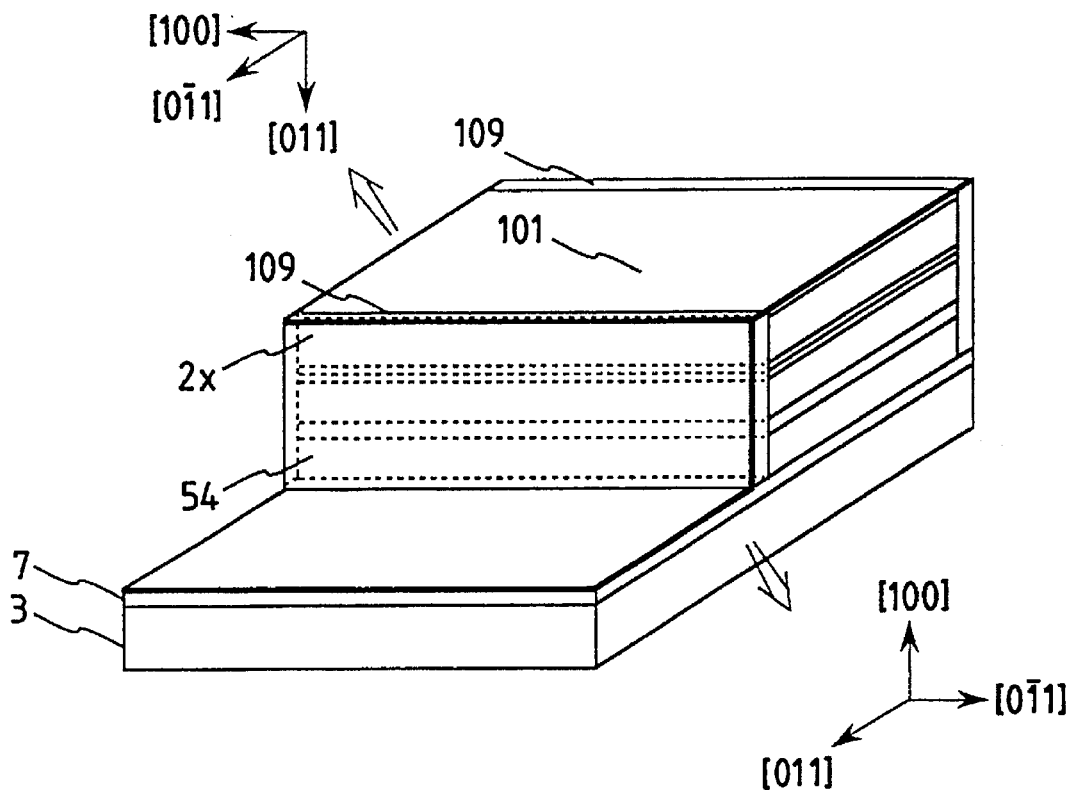
Figure 19B:
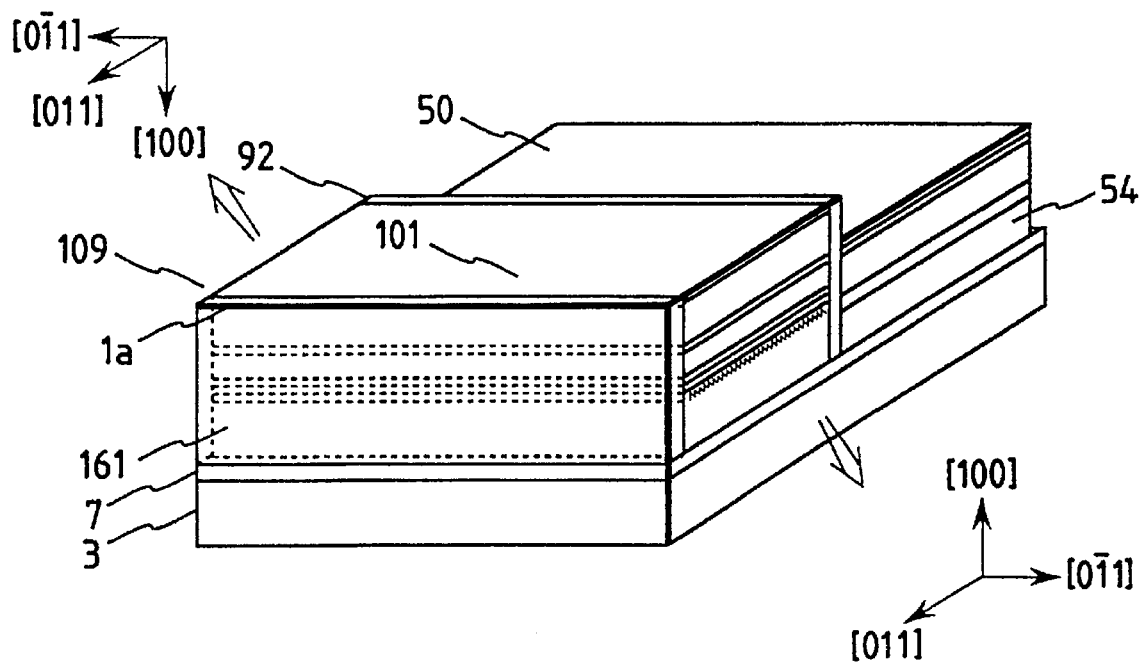
Figure 20A:
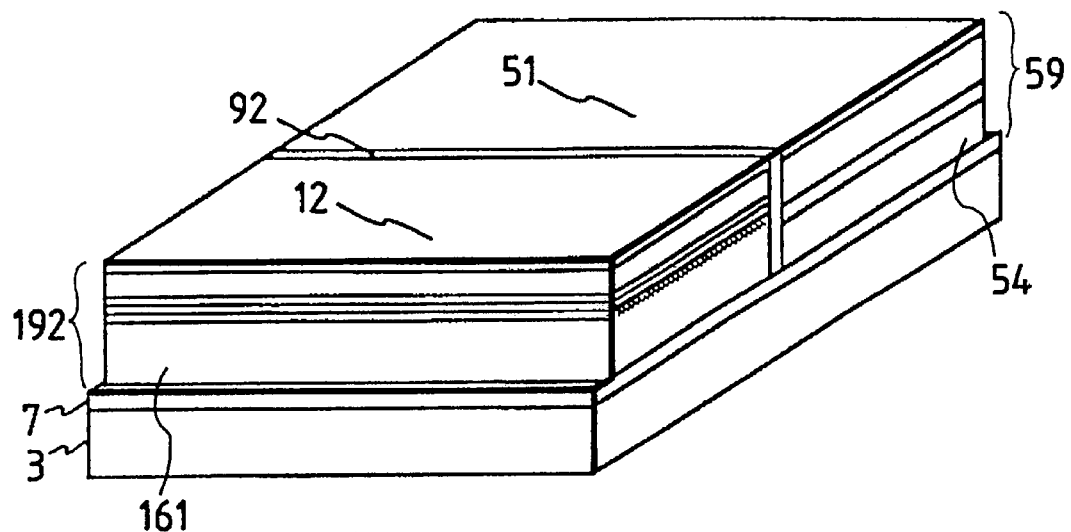

An n-Gap layer 7 (30 nm thick) is grown over a (100) n-Si substrate 3a by the MOCVD method. The surfaces of the n-Gap layer 7 and of the n-Al₀.₃Ga₀.₇As layer 54 of the optical frequency converter structure 59 are cleaned with a diluted sulfuric acid solution, washed with water and spinner-dried. The cleaned surfaces are placed face to face and directly bonded together in the same manner as in the second embodiment (FIG. 19A). Here, these are arranged so that the [0–11] direction of the (011) n-GaAs substrate 2x aligns with the [011] direction of the n-Si substrate 3a. After this, the n-GaAs substrate 2x is etched with a liquid mixture of sulfuric acid and hydrogen peroxide, and the SiO₂ end-surface protection film 109 and the SiO₂ film 101 are etched with a diluted HF solution. Then, the n-InP layer 161 of the laser structure 193, after being cleaned as mentioned above, is directly bonded in the same way as mentioned earlier onto a portion of the (100) n-Si substrate 3a adjacent to the optical frequency converter structure 59 (FIG. 19B). Here, these are arranged in such a way that the [011] direction of the (100) p-InP substrate 1a and the [011] direction of the n-Si substrate 3a are parallel and that the cleavage plane of the laser structure 193 on which the dielectric multiple film 92 is deposited contacts the cleavage plane of the optical frequency converter structure 59. Then, the SiO₂ end-surface protection film 109 and the SiO₂ film 101 are etched away by a diluted HF solution and the p-InP substrate 1a and the InGaP etch stop layer 50 are simultaneously removed by a diluted hydrochloric acid solution (FIG. 20A).

Figure 20B:
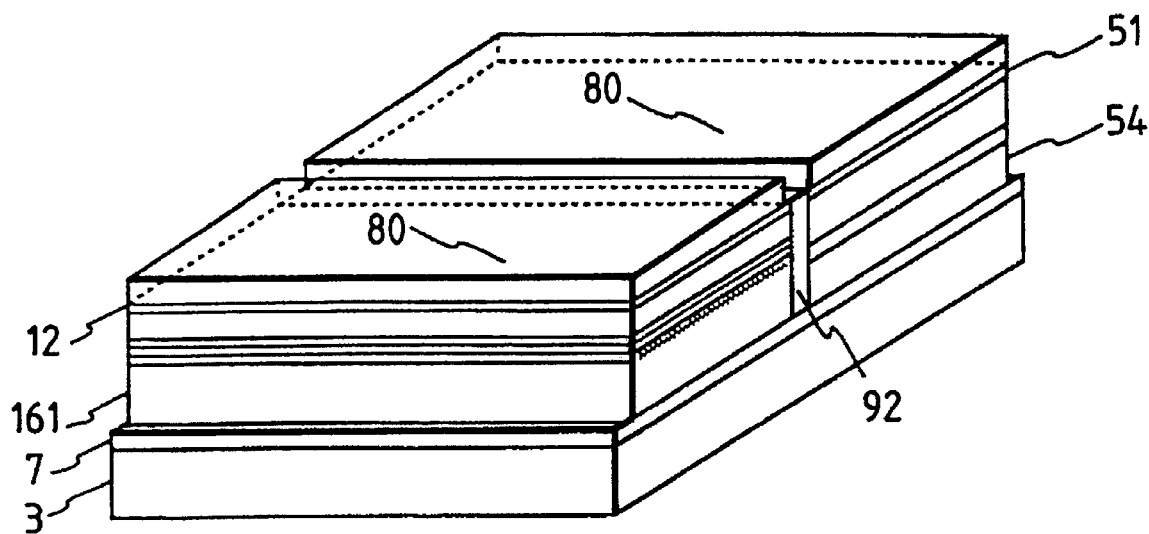

After this, a p-type electrode 80 is vapor-deposited on the n-GaAs cap layer 51 and the p⁺-InGaAsP contact layer a p-type electrode 80. To electrically isolate the optical frequency conversion element and the semiconductor laser, deposition is done except for an area 0.1 µm wide including the dielectric multiple film 92 (FIG. 20B). An SiO₂ film 98 (1.0 µm thick) is deposited on this wafer, and then a photoresist pattern 88 (2.0 µm thick) is formed in a geometry shown in FIG. 21A. This pattern is a stripe 4 µm wide, which, when formed on the semiconductor laser structure 193, is formed parallel to the [011] direction of the structure and, when formed on the optical frequency converter structure 59, is formed parallel to the [1–11] direction of the structure. It is noted, however, that the pattern is formed parallel to the [0–11] direction of the optical frequency converter element structure 59 near the end surfaces of the structure, i.e., parallel to the stripe on the semiconductor laser structure 193, and then is gradually curved to be parallel to the [1–11] direction. The radius of curvature for this curved portion is 3 mm.

Figure 21A:
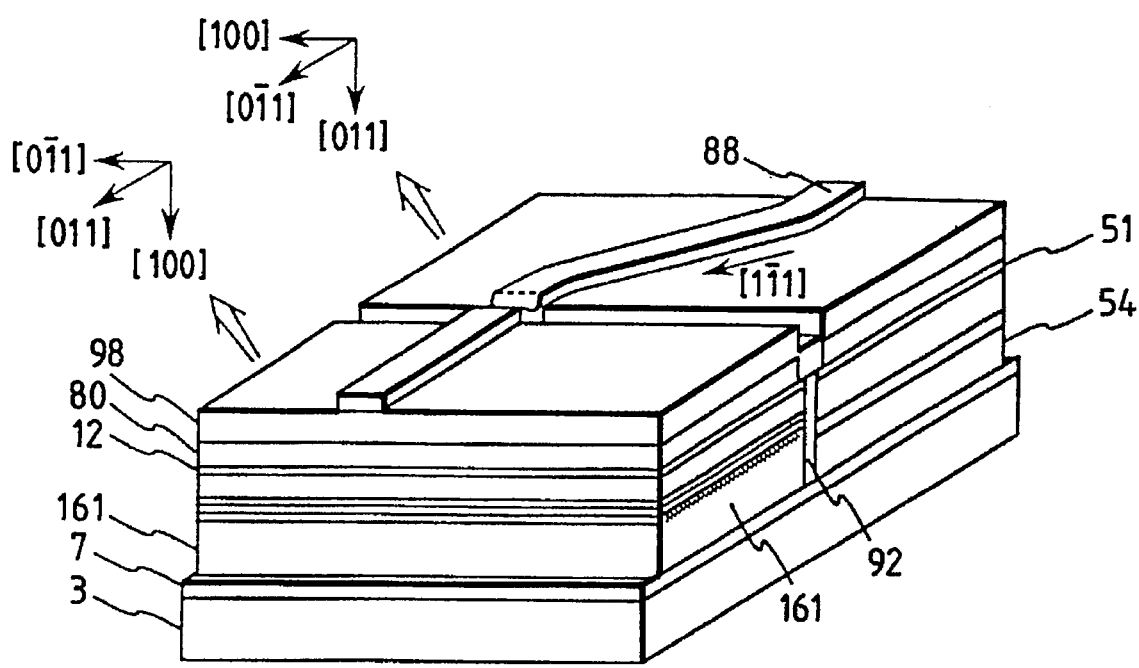
Figure 21B:
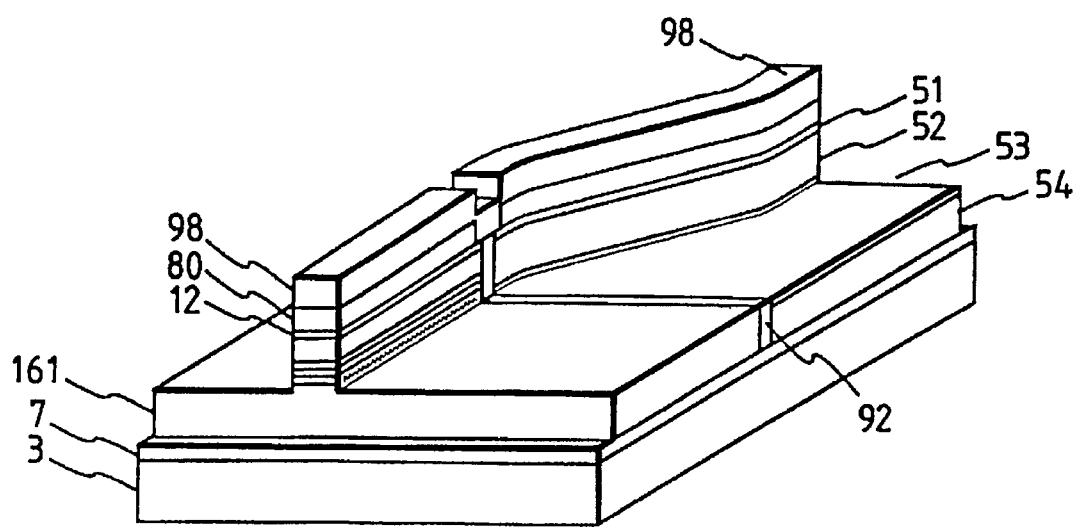
Figure 22A:
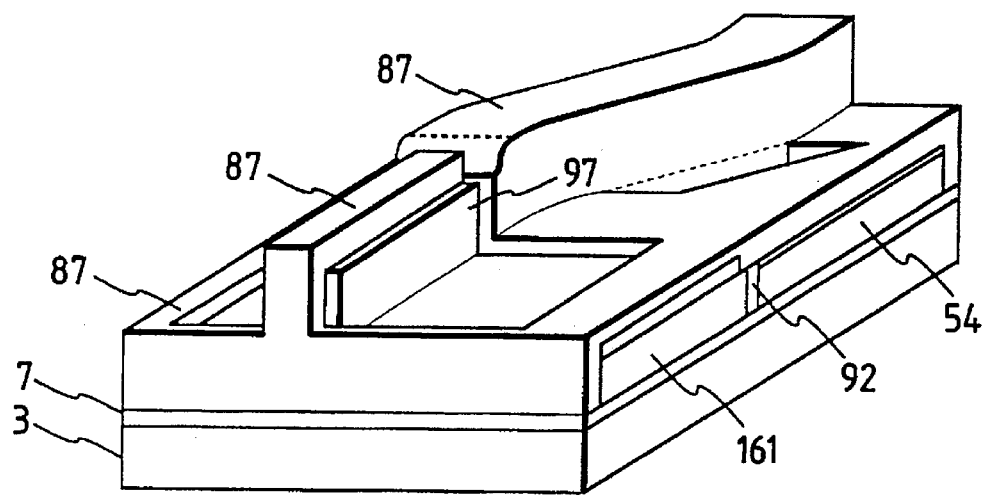
Figure 22B:
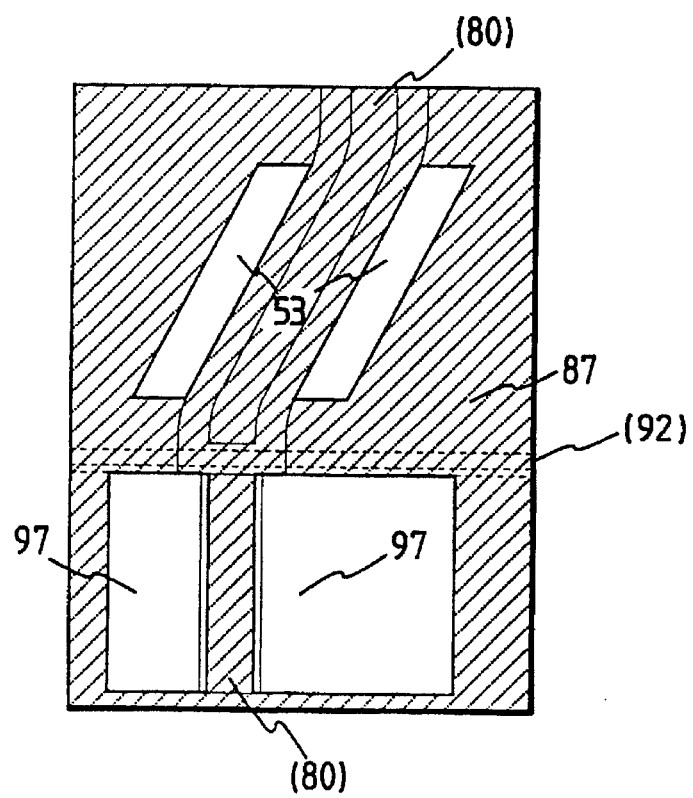
Figure 23A:
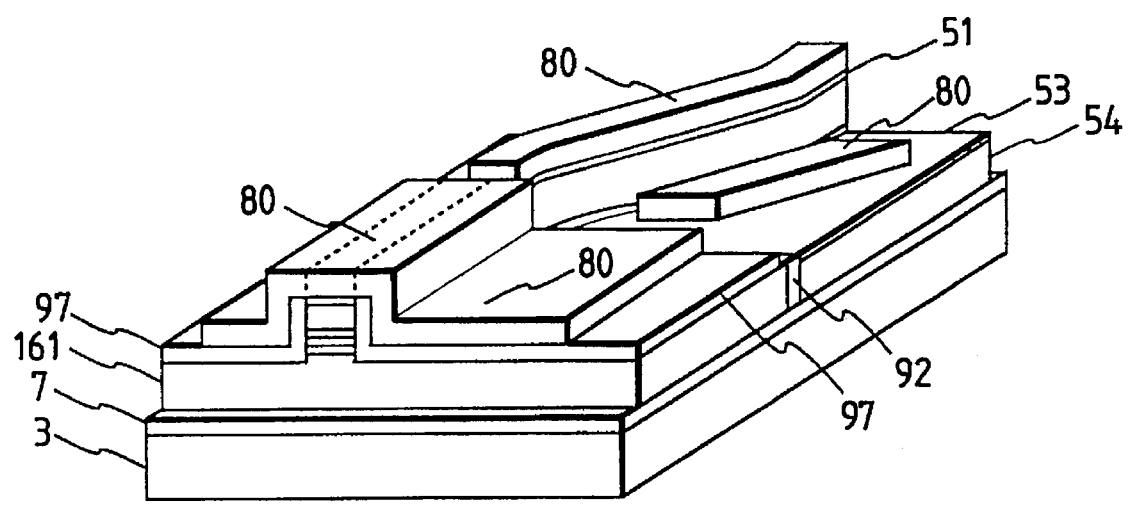

With this photoresist pattern 88 as a mask, the SiO₂ film 98 is etched by reactive ion etching (RIE) and the electrode 80 by ion milling. With the photoresist pattern 88 etched away and with the SiO₂ film 98 as a mask, the layers together with the optical frequency converter structure 59 and the semiconductor laser structure 193 are etched to the depth of 2.55 µm by RIBE (FIG. 21B). As a result, the optical frequency converter structure 59 is etched halfway into the GaAs core layer 53, and the semiconductor laser structure 193 is etched through the n-InGaAsP guide layer 152. After the SiO₂ film 98 is etched away with a diluted HF solution, an SiO₂ pattern 97 (1.0 µm thick) is deposited on the side walls of the stripe-shaped semiconductor laser structure 193 and a part of the surface of the n-InP layer 161, and a photoresist pattern 87 (2.0 µm thick) (FIG. 22A) is formed over the wafer. The top view of the photoresist pattern 87 and the SiO₂ pattern 97 is shown in FIG. 22B. This structure is further deposited with an electrode 80. After this, with the photoresist pattern 87 removed, the electrode 80 is left only where the photoresist pattern 87 was not formed (FIG. 23A).

Figure 23B:
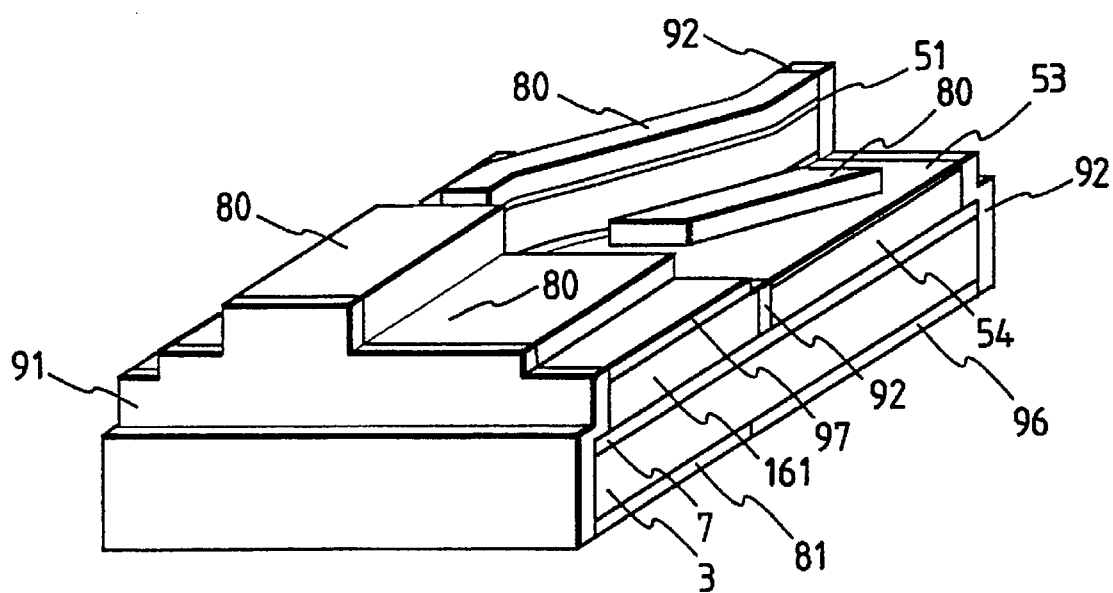

Further, the n-Si substrate 3a is polished from the back to a thickness of about 100 µm. An SiO₂ film 96 (0.4 µm thick) and then with a photoresist film 86 (3.0 µm thick) are deposited on the underside of the optical frequency conversion element structure 59 and the dielectric multiple film 92. The entire back surface is deposited with an n-type electrode 81 and the photoresist film 86 is removed to leave the n-type electrode 81 at the bottom of the semiconductor laser structure 193 (FIG. 23B). In the final step, a dielectric multiple film 91 is deposited on the end surface on the semiconductor laser side to enhance the light reflection factor, and a dielectric multiple film 92 is deposited on the other end surface on the optical frequency conversion device side. In this way, the rotating phase-plate type optical frequency converter and the distributed feedback MQW semiconductor laser of a long wavelength range are integrally fabricated on the Si substrate.

In this integrated device, the frequency of the semiconductor laser is converted according to the voltage that is applied to the optical frequency converter while the semiconductor laser is driven by a certain voltage. The optical frequency converter, as described in Japan Patent Application No. 150724/1981, converts the frequency of light according to changes in the refractive index caused by the applied voltage, and requires the optical waveguide to be formed parallel to the [1–11] direction of the structure. This makes it necessary to use a substrate with a special crystallographic orientation such as a (011) plane. The semiconductor laser, fabricated on the (100) plane, has already been commercialized. Fabrication of the laser on other crystal planes such as (011) plane has so far seen only a few trials. That is, the optical frequency conversion device and the semiconductor laser have different optimum substrate crystallographic orientations. It has, therefore, been impossible to integrate them by epitaxial growth. But with this invention, there is no restrictive relationship in the crystallographic orientation between the substrate and the device fabricated on it, as mentioned earlier, and the use of different materials for the substrate and the device will have little effect on the characteristics of the device. As a result, the integrated device such as this embodiment can be fabricated.

Because the optical frequency converter and the semiconductor laser are electrically isolated, there is no crosstalk between these devices. Further, because the optical waveguide is formed after the optical frequency converter structure and the semiconductor laser structure have been directly bonded, there is no deviation in optical coupling between the optical frequency converter and the semiconductor laser. In this embodiment, the Si substrate and the GaAs-InP substrate with different lattice constants and different constitutional elements are directly bonded. To that end, direct bonding is done after a buffer layer is formed over the Si substrate. That is, a GaP layer is grown beforehand over the Si substrate and because the layers of similar constitutional elements, GaP and GaAs-InP, are directly bonded, the rearrangement of atoms is likely to occur at the bonded interface, thus producing a smooth interface. Such a buffer layer may be formed of other materials as long as they produce the similar effects. It is also possible to directly bond the device onto the surface of the Si substrate without forming a buffer layer, as in the case of the first embodiment.

In this embodiment, to enable a further integration with other electronic devices such as transistors, an optical frequency converter and a semiconductor laser are directly bonded and integrated on the Si substrate. When used for other purposes, they may be directly bonded and integrated on another substrate. And depending on the electronic device to be manufactured, the Si substrate may be a substrate with a different crystallographic orientation, such as a (111) substrate. When, on the other hand, this integrated structure is to be used independently with no further integration, it may be formed on a (011) GaAs substrate or (100) InP substrate. That is, after the optical frequency converter structure is grown on a (011) n-GaAs substrate, a part of the structure is removed and the semiconductor laser structure formed on the (100) p-InP substrate is directly bonded onto the removed part, thus integrating the devices on the (011) n-GaAs substrate. In this case, it should be noted, however, that the optical frequency converter structure is epitaxially grown in a sequence reverse to that of this embodiment. In the similar manner, the devices may be integrated on the (100) InP substrate.

While in this embodiment the distributed feedback MQW semiconductor laser of a long wavelength range with the wavelength of 1.3 μm has been described to be integrated, this invention can also be applied to the integration of lasers of other wavelength ranges. The device lengths and stripe widths of the semiconductor laser and the optical frequency converter are not limited to those of this embodiment. Although this embodiment makes equal the stripe widths of the optical frequency converter and the semiconductor laser, they may have different stripe widths. Further, the materials of the optical frequency converter and the semiconductor laser may be other than those of this embodiment.

While this embodiment has described the integration of a semiconductor laser and an optical frequency converter, this embodiment can also be applied to integration of other devices. The number and kind of the devices to be integrated are not limited to those of this embodiment, and three or more kinds of devices can be integrated. In this embodiment, too, a light detecting device and an optical modulator may be included among elements to be integrated through direct bonding. Depending on the devices to be integrated, the combination of substrate and semiconductor structure to be directly bonded is not limited to the one employed in this embodiment. Nor are the crystallographic orientation relation between the device and the substrate, the procedure and conditions of direct bonding and the epitaxial growth process.

As described above, the present invention makes it possible to manufacture a novel device structure, which has not been able to be produced with the conventional technique, particularly with epitaxial growth, by directly bonding two semiconductor substrates in such a way that in a cross section perpendicular to their direct-bonded interface their crystal structures differ from each other or their lattice orders are not equivalent. Here, the discontinuity of the bonded interface or the direct bonding of different kinds of semiconductor structures has little effect on the device characteristics. Further, this invention can be applied to the direct bonding of any combinations of the same kinds or different kinds of semiconductors. Three or more kinds of semiconductors can also be directly bonded. All these features combine to greatly enhance the degree of freedom of design of integrated devices.

What is claimed is:

1. A semiconductor device comprising:
   a first semiconductor structure having a first lattice constant; and
   a second semiconductor structure directly bonded onto the first semiconductor structure and having a second lattice constant different from the first lattice constant; wherein in a cross section perpendicular to a bonded interface of the first and second semiconductor structures, crystal structures of the first semiconductor structure and the second semiconductor structure differ from each other, and crystallographic orientations of the first and second semiconductor structures, perpendicular to a bonding interface between the first and second semiconductor structures, are different.

2. A semiconductor device according to claim 1, wherein the second semiconductor structure has as a unit lattice the same Bravais lattice as that of the first semiconductor structure.

3. A semiconductor device according to claim 1, wherein the first semiconductor structure is made of Si and the second semiconductor structure is made of compound semiconductors.

4. A semiconductor device according to claim 3, wherein the compound semiconductors are III–V or II–VI group compounds.

5. A semiconductor device according to claim 4, wherein the direct bonding is a bonding done by placing a (011) plane of the first semiconductor structure and a (100) plane of the second semiconductor structure face to face.

6. A semiconductor device according to claim 4, constituting an optical semiconductor device.

7. A semiconductor device according to claim 6, wherein the optical semiconductor device is an edge-emitting type light emitting device.

8. A semiconductor device according to claim 7, wherein the edge-emitting type light emitting device is a distributed feedback device formed with a grating.

9. A semiconductor device according to claim 6, wherein the optical semiconductor device is a waveguide type light detecting device.

10. A semiconductor device according to claim 6, wherein the optical semiconductor device operates by utilizing changes in refractive index of light in the semiconductor caused by voltage application.

11. A semiconductor device according to claim 1, wherein the first semiconductor structure and the second semiconductor structure are made of compound semiconductors.

12. A semiconductor device according to claim 11, wherein the compound semiconductors are III–V or II–VI group compounds.

13. A semiconductor device according to claim 12, wherein the direct bonding is a bonding done by placing (100) planes of the first semiconductor structure and the second semiconductor structure face to face.

14. A semiconductor device according to claim 12, constituting an optical semiconductor device.

15. A semiconductor device according to claim 14, wherein the optical semiconductor device is an edge-emitting irradiation type light emitting device.

16. A semiconductor device according to claim 15, wherein the edge-emitting irradiation type light emitting device is a distributed feedback device formed with a grating.

17. A semiconductor device according to claim 14, wherein the optical semiconductor device is a waveguide type light detecting device.

18. A semiconductor device according to claim 14, wherein the optical semiconductor device operates by utilizing changes in refractive index of light in the semiconductor caused by voltage application.

19. A semiconductor device comprising:
a first semiconductor structure having a first lattice constant; and
a second semiconductor structure directly bonded onto the first semiconductor structure and having a second lattice constant different from the first lattice constant;
wherein in a cross section perpendicular to a bonding interface of the first and second semiconductor structures, lattice orders of the first semiconductor structure and the second semiconductor structure are not equivalent, and crystallographic orientations of the first and second semiconductor structures, perpendicular to the bonding interface therebetween, are different.

20. A semiconductor device according to claim 19, wherein the second semiconductor structure has as a unit lattice the same Bravais lattice as that of the first semiconductor structure.

21. A semiconductor device according to claim 19, wherein the first semiconductor structure is made of Si and the second semiconductor structure is made of compound semiconductors.

22. A semiconductor device according to claim 21, wherein the compound semiconductors are III–V or II–VI group compounds.

23. A semiconductor device according to claim 22, wherein the direct bonding is a bonding done by placing a (011) plane of the first semiconductor structure and a (100) plane of the second semiconductor structure face to face.

24. A semiconductor device according to claim 22, constituting an optical semiconductor device.

25. A semiconductor device according to claim 24, wherein the optical semiconductor device is an edge-emitting type light emitting device.

26. A semiconductor device according to claim 25, wherein the edge-emiting type light emitting device is a distributed feedback device formed with a grating.

27. A semiconductor device according to claim 24, wherein the optical semiconductor device is a waveguide type light detecting device.

28. A semiconductor device according to claim 24, wherein the optical semiconductor device operates by utilizing changes in refractive index of light in the semiconductor caused by voltage application.

29. A semiconductor device according to claim 19, wherein the first semiconductor structure and the second semiconductor structure are made of compound semiconductors.

30. A semiconductor device according to claim 29, wherein the compound semiconductors are III–V or II–VI group compounds.

31. A semiconductor device according to claim 30, wherein the direct bonding is a bonding done by placing (100) planes of the first semiconductor structure and the second semiconductor structure face to face.

32. A semiconductor device according to claim 30, constituting an optical semiconductor device.

33. A semiconductor device according to claim 32, wherein the optical semiconductor device is an edge-emitting irradiation type light emitting device.

34. A semiconductor device according to claim 33, wherein the edge-emitting irradiation type light emitting device is a distributed feedback device formed with a grating.

35. A semiconductor device according to claim 32, wherein the optical semiconductor device is a waveguide type light detecting device.

36. A semiconductor device according to claim 32, wherein the optical semiconductor device operates by utilizing changes in refractive index of light in the semiconductor caused by voltage application.

37. A semiconductor device comprising:
a first semiconductor structure having a first lattice constant;
a second semiconductor structure directly bonded onto a part of the surface of the first semiconductor structure, the second semiconductor structure having a second lattice constant and having as a unit lattice the same Bravais lattice as that of the first semiconductor structure; and
a third semiconductor structure directly bonded onto or epitaxially grown on another part of the surface of the first semiconductor structure, the third semiconductor structure having a third lattice constant and having as a unit lattice the same Bravais lattice as that of the first semiconductor structure;
wherein in a cross section perpendicular to a bonded interface of the first and second semiconductor structures, lattice orders of the first semiconductor structure and the second semiconductor structure are not equivalent.

38. A semiconductor device according to claim 37, wherein in any cross section perpendicular to a bonded interface of the first and third semiconductor structures, lattice orders of the first semiconductor structure and the third semiconductor structure are equivalent.

39. A semiconductor device according to claim 38, wherein the first semiconductor structure is made of Si and the second and third semiconductor structures are made of compound semiconductors.

40. A semiconductor device according to claim 39, wherein the compound semiconductors are III–V or II–VI group compounds.

41. A semiconductor device according to claim 40, wherein the semiconductor device is a photonic integrated device or opto-electronic integrated device comprising two or more kinds of device elements.

42. A semiconductor device according to claim 38, wherein the first, second and third semiconductor structures are formed of compound semiconductors.

43. A semiconductor device according to claim 42, wherein the compound semiconductors are III–V or II–VI group compounds.

44. A semiconductor device according to claim 43, wherein the semiconductor device is a photonic integrated device or opto-electronic integrated device comprising two or more kinds of device elements.

45. A semiconductor device according to claim 37, wherein the third semiconductor structure is directly bonded onto the surface of the first semiconductor structure, and the lattice orders of the first semiconductor structure and the third semiconductor structure in a cross section perpendicular to the bonded interface of the semiconductor device are not equivalent.

46. A semiconductor device according to claim 45, wherein in any cross section perpendicular to the bonded interface of the semiconductor device, lattice orders of the second semiconductor structure and the third semiconductor structure are equivalent.

47. A semiconductor device according to claim 46, wherein the first semiconductor structure is made of Si and the second and third semiconductor structures are made of compound semiconductors.

48. A semiconductor device according to claim 47, wherein the compound semiconductors are III–V or II–VI group compounds.

49. A semiconductor device according to claim 48, wherein the semiconductor device is a photonic integrated device or opto-electronic integrated device comprising two or more kinds of device elements.

50. A semiconductor device according to claim 46, wherein the first, second and third semiconductor structures are made of compound semiconductors.

51. A semiconductor device according to claim 50, wherein the compound semiconductors are III–V or II–VI group compounds.

52. A semiconductor device according to claim 51, wherein the semiconductor device is a photonic integrated device or opto-electronic integrated device comprising two or more kinds of device elements.

53. A semiconductor device according to claim 45, wherein the lattice orders of the second semiconductor structure and the third semiconductor structure in a cross section perpendicular to the bonded interface of the semiconductor device are not equivalent.

54. A semiconductor device according to claim 53, wherein the first semiconductor structure is made of Si and the second and third semiconductor structures are made of a compound semiconductor.

55. A semiconductor device according to claim 54, wherein the compound semiconductor is a III–V or II–VI group compound.

56. A semiconductor device according to claim 55, wherein the semiconductor device is a photonic integrated device or opto-electronic integrated device comprising two or more kinds of device elements.

57. A semiconductor device according to claim 53, wherein the first, second and third semiconductor structures are made of a compound semiconductor.

58. A semiconductor device according to claim 57, wherein the compound semiconductor is a III–V or II–VI group compound.

59. A semiconductor device according to claim 58, wherein the semiconductor device is a photonic integrated device or opto-electronic integrated device comprising two or more kinds of device elements.

60. A semiconductor device according to claim 5, wherein the direct bonding is a bonding done by placing one of {111} planes of the first semiconductor structure perpendicular to its (011) plane and one of {011} planes of the second semiconductor structure perpendicular to its (100) planes parallel to each other.

61. A semiconductor device according to claim 13, wherein the direct bonding is a bonding done by placing [0–11] orientations of the first semiconductor structure and the second semiconductor structure parallel to each other, or [011] orientations of the first semiconductor structure and the second semiconductor structure parallel to each other.

62. A semiconductor device according to claim 23, wherein the direct bonding is a bonding done by placing one of {111} planes of the first semiconductor structure perpendicular to its (011) plane and one of {011} planes of the second semiconductor structure perpendicular to its (100) planes parallel to each other.

63. A semiconductor device according to claim 31, wherein the direct bonding is a bonding done by placing [0–11] orientations of the first semiconductor structure and the second semiconductor structure parallel to each other, or [011] orientations of the first semiconductor structure and the second semiconductor structure parallel to each other.

64. A semiconductor device according to claim 4, wherein the bonding plane of the first semiconductor structure is (011), and the bonding plane of the second semiconductor structure is (100), at the bonding interface, and wherein one of {111} planes of the first semiconductor structure and one of {011} planes of the second semiconductor structure are parallel to each other.

65. A semiconductor device according to claim 12, wherein the bonding plane of the first semiconductor structure is (100), and the bonding plane of the second semiconductor structure is (100), at the bonding interface, and wherein [0–11] orientations of the first and second semiconductor structures are parallel to each other, or [011] orientations of the first and second semiconductor structures are parallel to each other.

66. A semiconductor device according to claim 22, wherein the bonding plane of the first semiconductor structure is (011), and the bonding plane of the second semiconductor structure is (100), at the bonding interface, and wherein one of {111} planes of the first semiconductor structure and one of {011} planes of the second semiconductor structure are parallel to each other.

67. A semiconductor device according to claim 30, wherein the bonding plane of the first semiconductor structure is (100), and the bonding plane of the second semiconductor structure is (100), at the bonding interface, and wherein [0–11] orientations of the first and second semiconductor structures are parallel to each other, or [011] orientations of the first and second semiconductor structures are parallel to each other.

68. A semiconductor device comprising:

a first semiconductor structure; and a second semiconductor structure directly bonded to the first semiconductor structure, wherein crystallographic orientations of the first and second semiconductor structures, perpendicular to a bonding interface between the first and second semiconductor structures, are different.

69. A semiconductor device according to claim 68, wherein, in a cross section perpendicular to the bonding interface between the first and second semiconductor structures, crystal structures of the first and second semiconductor structures differ from each other.

* * * * *